(12) United States Patent
Minakata

(10) Patent No.: US 7,061,010 B2
(45) Date of Patent: Jun. 13, 2006

(54) ORGANIC SEMICONDUCTOR ELEMENT

(75) Inventor: Takashi Minakata, Shizuoka (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 82 days.

(21) Appl. No.: 10/486,276

(22) PCT Filed: Aug. 7, 2002

(86) PCT No.: PCT/JP02/08070

§ 371 (c)(1),
(2), (4) Date: Feb. 9, 2004

(87) PCT Pub. No.: WO03/016599

PCT Pub. Date: Feb. 27, 2003

(65) Prior Publication Data

US 2005/0258417 A1    Nov. 24, 2005

(30) Foreign Application Priority Data

Aug. 9, 2001    (JP) .............................. 2001-242808

(51) Int. Cl.
    *H01L 35/24* (2006.01)
(52) U.S. Cl. ......................................... 257/40; 438/99
(58) Field of Classification Search ................ 257/40; 438/82, 99
    See application file for complete search history.

(56) References Cited

U.S. PATENT DOCUMENTS 6,203,933 B1    3/2001    Nakaya et al.

FOREIGN PATENT DOCUMENTS

EP    0 786 820 A2    7/1997
JP    5-55568 A    3/1993

OTHER PUBLICATIONS

Schon et al., Science, vol. 289, pp. 599-601, (2000).
Schon et al., Science, vol. 287, pp. 1022-1023, (2000).
Dimitrakopoulos et al., J. Appl. Phys., vol. 80, No. 4, pp. 2501-2508, (1996).
Schon et al., Nature, vol. 403, pp. 408-410, (2000).
Klauk et al., IEEE Trans. On Elec. Devices, vol. 46, No. 6, pp. 1258-1263, (1999).

(Continued)

*Primary Examiner*—Sara Crane
(74) *Attorney, Agent, or Firm*—Birch, Stewart, Kolasch & Birch, LLP

(57) ABSTRACT

The present invention relates to an organic semiconductor thin film suitably employed in electronics, photonics, bio-electronics, or the like, and a method for forming the same. The present invention further relates to a solution for an organic semiconductor used to form the organic semiconductor thin film and an organic semiconductor device using the organic semiconductor thin film.

The transistor of the present invention is manufactured by forming sequentially a gate electrode (2), an insulator layer (3), a source electrode and drain electrode (4, 4) on a glass substrate (5), applying thereto a 0.05% (by mass) solution of pentacene in o-dichlorobenzene and drying the solution to form an organic semiconductor thin film (1).

The present invention provides a transistor with superior electronic characteristics because the organic semiconductor thin film (1), which can be formed easily at low cost, is almost free of defects.

24 Claims, 12 Drawing Sheets

OTHER PUBLICATIONS

Brown et al., J. Appl. Phys., vol. 79, No. 4, pp. 2136-2138, (1996).

Takahashi et al., J. Am. Chem. Soc., vol. 122, pp. 12876-12877, (2000).

Graham et al., J. Org. Chem., vol. 60, pp. 5770-5777, (1995).

Anthony et al., Organic Letters, vol. 2, No. 1, pp. 85-87, (2000).

Miller et al., Organic Letters, vol. 2, No. 25, pp. 3979-3982, (2000).

ORGANIC SEMICONDUCTOR ELEMENT

TECHNICAL FIELD

The present invention relates to an organic semiconductor thin film suitably employed in electronics, photonics, bioelectronics, or the like, and a method for forming the same. The present invention further relates to a solution for organic semiconductors used to form the organic semiconductor thin film and an organic semiconductor device using the organic semiconductor thin film.

BACKGROUND ART

Organic semiconductor devices require milder film-forming conditions than conventional inorganic semiconductor devices. Because it is possible to form semiconductor thin films on various substrates and at ordinary temperature, there are expectations for low cost and flexible nature by forming thin films on polymer films and the like.

Organic semiconductor materials thus far studied include polyphenylenevinylene, polypyrrole, polythiophene, oligothiophene, as well as polyacenes such as anthracene, tetracene and pentacene. It has been reported that polyacenes, in particular, have high crystallinity due to their strong intermolecular cohesive force, resulting in high carrier mobility and resultant superior semiconductor device characteristics.

The form of polyacene applied to a device includes a vapor deposition film or single crystals, and its application to transistors, solar cells and lasers has been studied (Shone et al., Science, 289, p559 (2000); Shone et al., Science, 287, p1022 (2000); Dimitrakopourasu et al., Journal of Applied Physics, 80, p2501 (1996); Shone et al., Nature, 403, p408 (2000); and Croke et al., IEEE Transaction On Electron Devices, 46, p1258 (1999)).

However, because these vapor deposition films and single crystals are formed in a vacuum vessel, they require expensive and complex equipment and in the case of single crystals, useful devices have been limited in size.

On the other hand, a method for forming a thin film of pentacene that is a kind of polyacene by applying a solution of a pentacene precursor on a substrate and heating it has been reported (Brown et al., Journal of Applied Physics, 79, p2136, (1996)). Since polyacenes are hardly soluble, a soluble precursor was used to form a thin film, which was heated to convert it into a polyacene.

However, the method using a precursor required treatment at a temperature as high as 150° C. to convert the precursor to a polyacene. In addition, non-reacted portions remained because a complete conversion to the polyacene was difficult, and denaturation due to high temperature occurred.

Polyacenes having substituents have been reported by Takahashi et al. (Journal of American Chemical Society, 122, p12876 (2000)), Graham et al. (Journal of Organic Chemistry, 60, p5770 (1995)), Anthony et al. (Organic Letters, 2, p85 (2000)) and Miller et al. (Organic Letters, 2, p3979 (2000)). These reports describe derivatives of various polyacenes having introduced substituents, but no description has been given as to their characteristics as organic semiconductor materials nor a method for forming thin films.

Hence, it is an object of the present invention to solve the problems of prior art described above and provide a solution for organic semiconductor that can be used to easily form a defect-free organic semiconductor thin film with high crystallinity at a low cost. Another object of the present invention is to provide a defect-free organic semiconductor thin film and a method for forming the same. Yet another object of the present invention is to provide an organic semiconductor device with superior electronic characteristics.

DISCLOSURE OF THE INVENTION

To solve the problems described above, the present invention has the composition below. The solution for organic semiconductors of the present invention comprises a polyacene and a solvent at least comprising a polyacene dissolving solvent capable of dissolving the polyacene, wherein the polyacene dissolving solvent is at least one compound selected from the group consisting of halogenated aromatic hydrocarbons, halogenated aliphatic hydrocarbons, aromatic hydrocarbons, lactones and carbonates.

These solutions for organic semiconductor are applied on a substrate and the solvent is subjected to vaporization and so forth to form an organic semiconductor thin film. Organic semiconductor thin films can be easily produced at low cost by this method. In addition, since the solution of organic semiconductor contains a dissolved polyacene, the method is free from the aforementioned problems when a precursor is used, i.e. the necessity for high-temperature treatment during the process and the likelihood of defects in the organic semiconductor thin film due to non-reacted or denatured portions.

Polyacenes that maybe used include anthracene, tetracene (naphthacene), pentacene, hexacene, heptaceneandnanoacene.

The derivatives of these polyacenes may also be used. That is, these polyacenes may have functional groups such as aliphatic hydrocarbons (alkyls, alkenylsandalkynyls, etc.), aromatic hydrocarbons (phenyl, naphtyl, etc.), alkoxyls, halogens, acyls (benzoyl, etc.), esters, ethers, aminos, hydroxyl, amides, cyanos, silyls, photoreactive groups or combinations of two or more of these functional groups (benzyls, etc.). The quinone derivatives of these polyacenes may also be used. Further, composites produced by addition thereof to a fullerene or a short carbon nanotube may be used.

One or more hydrogen atoms on the aromatic rings of a polyacene may be replaced by the functional groups mentioned above. If two or more hydrogen atoms are replaced by such functional groups, these functional groups may be identical or different from each other. In addition, these polyacenes and their derivatives may be used alone or in a combination of two or more thereof.

The derivatives of polyacenes are represented by the following chemical formula (I):

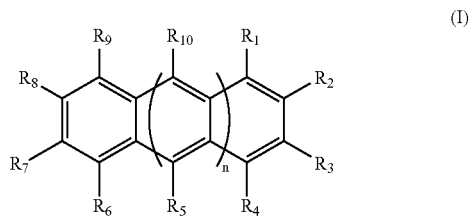

(I)

wherein the functional groups $R_1$ to $R_{10}$ are independently the functional groups mentioned above or a hydrogen atom; and n represents an integer from 2 to 7, and the characteristics depend on the positions where the functional groups are substituted.

The derivatives of polyacenes are classified into the following three groups:

Group 1: Polyacenes wherein at least one of the functional groups $R_2$, $R_3$, $R_7$ and R8 in chemical formula (I) represents one of the functional groups mentioned above and the other groups are all hydrogen atoms.

Group 2: Polyacenes wherein at least one of the functional groups $R_1$, $R_4$, $R_5$, $R_6$, $R_9$ and $R_{10}$ represents one of the functional groups mentioned above and the other groups are all hydrogen atoms.

Group 3: Polyacenes wherein at least one of the functional groups $R_2$, $R_3$, $R_7$ and $R_8$ and at least one of the functional groups $R_1$, $R_4$, $R_5$, $R_6$, $R_9$ and $R_{10}$ represent one of the functional groups mentioned above and the other groups are all hydrogen atoms.

The derivatives in Group 1 have functional groups only at the substitution positions in the long-axis direction, and the derivatives in Group 2 have functional groups only at the substitution positions in the short-axis direction. These derivatives are preferable since they enable high mobility in organic semiconductor thin films. The reason for this property has not been clarified. However, it seems to be because carrier transport is likely to be blocked by functional groups if a polyacene has functional groups at the substitution positions in both the long and short-axis directions as in those in Group 3, since molecules of a polyacene are in stacked form in a thin film.

Of the various functional groups mentioned above, normal, branched or cyclic aliphatic hydrocarbon groups with 1 to 15 carbon atoms are most preferable. The aliphatic hydrocarbon groups may be saturated or unsaturated, and the position of unsaturated bond of an unsaturated hydrocarbon group is not particularly limited.

Unsaturated hydrocarbon groups have improved rigidity of the functional groups due to unsaturated bonds. An unsaturated bond may be replaced by other molecules or reacted or polymerized with another unsaturated bond. Thin films composed of polyacenes with unsaturated bonds, allowed to react as above, may also be used as organic semiconductor thin films.

Thus, the introduction of a functional group with reactivity and polymerizable property, such as unsaturated hydrocarbon groups, into a polyacene will allow an organic semiconductor thin film to be denatured through the reaction of the functional groups. The introduction of a functional group that is photoreactive and photopolymerizable, in particular, into a polyacene will make the polyacene photosensitive. A polyacene with photosensitivity may be useful as a light patterning material.

A particular site of an organic semiconductor thin film composed of a polyacene having photoreactive and photopolymerizable groups can be denatured by applying radiation energy thereto. Patterning may be performed using any of differences in physical properties (solubility in solvent, vapor pressure, etc.) between the irradiated and non-irradiated positions.

Radiation energy may also be applied to a solution of a polyacene with photoreactive and photopolymerizable groups to denature the polyacene in order to adjust the viscosity of the solution for organic semiconductors. Radiation energy may also be applied to the bulk of a polyacene with photoreactive and photopolymerizable groups to denature the polyacene in order to adjust the solubility of the polyacene.

Examples of the photoreactive and photopolymerizable groups include acryloyloxy, methacryloyloxy, cinnamoyloxy, cinnamyl, butadiinyl, styryl, butadienyl, isopentadienyl, cyclopentadienyl, cyclohexadienyl and hydroxyphenyl groups.

The radiation energy includes infrared ray, ultraviolet ray, visible ray, microwave, X ray, gamma ray and electron ray.

The content of the polyacene in an organic semiconductor solution is preferably 0.01 to 8% by mass. A content of less than 0.01% by mass may result in too thin an organic semiconductor film or imperfect coating of the substrate with the organic semiconductor thin film. On the other hand, a content of more than 8% by mass may result in instability of the organic semiconductor solution, thereby causing deposition of the polyacene from the organic semiconductor solution, and roughen the surface of the organic semiconductor thin film.

To prevent these inconveniences, the content of a polyacene should more preferably be 0.02 to 5% by mass, and most preferably 0.05 to 3% by mass.

In the present invention, the polyacene dissolving solvents preferably include halogenated aromatic hydrocarbons, halogenated aliphatic hydrocarbons, aromatic hydrocarbons, lactones and carbonates.

The halogenated aromataic hydrocarbons include chlorobenzene, bromobenzene, iodobenzene, o-dichlorobenzene, m-dichlorobenzene, o-dibromobenzene, m-dibromobenzene, o-diiodobenzene, m-diiodobenzene, chlorotoluene, bromotoluene, iodotoluene, dichlorotoluene, dibromotoluene, difluorotoluene, chloroxylene, bromoxylene, iodoxylene, chloroethylbenzene, bromoethylbenzene, iodoethylbenzene, dichloroethylbenzene, dibromoethylbenzene, and chlorocyclopentadiene.

The halogenated aliphatic hydrocarbons include bromoform, dichloromethane, dichloroethane, trichloroethane, difluoroethane, fluorochloroethane, chloropropane, dichloropropane, chloropentane and chlorohexane.

Furthermore, the aromatic hydrocarbons include xylene, mesitylene and methylnaphthalene.

The lactones include γ-butyrolactone and propiolactone.

Furthermore, the carbonate compounds include dimethyl carbonate, diethyl carbonate, methylethyl carbonate, propylene carbonate and butylene carbonate.

Of the polyacene dissolving solvents described above, halogenated aromatic and aliphatic hydrocarbons are more capable of dissolving polyacenes and hence more preferable. Of halogenated aromatic hydrocarbons, dihalogenated aromatic hydrocarbons, in particular, are highly capable of dissolving polyacenes, with a larger number of condensed rings, such as pentacene and hexacene, and thus particularly preferable.

These polyacene dissolving solvents may be used alone or in a combination of two or more thereof as a solvent for a solution for organic semiconductor. Preferably, the content of polyacene dissolving solvents in a solution for organic semiconductor is equal to or less than 99.99% by mass. If the content thereof exceeds 99.99% by mass, the content of the polyacene is too low, and this may, as mentioned above, result in too thin an organic semiconductor thin film and incomplete coating of the substrate with the organic semiconductor thin film.

In addition, the polyacene dissolving solvent may be mixed with a different type of solvent to form a solvent of the solution for organic semiconductor in light of adjusting the vaporization rate of the solvent during the manufacture of the organic semiconductor thin film and the (dissolving and swelling) effects of the organic semiconductor solution on the substrate. In these cases, the content of polyacene dissolving solvents in an organic semiconductor solution should be equal to or more than 10% by mass. If the content is less than 10% by mass and the solubility of the polyacene becomes too low, it will become difficult to obtain an organic semiconductor solution with a sufficient amount of dissolved polyacene.

These organic semiconductor solutions may contain electron-donating molecules (donor molecules) or electron-accepting molecules (acceptor molecules) that can form a charge-transfer complex with the polyacene. Using this process, the solubility and hence the content of polyacenes can be improved.

The donor molecules of the present invention include TTF compounds, such as tetrathiafulvalene, tetramethyltetrathiafulvalene and tetraselenathiafulvalene, phenylenediamine compounds, such as tetraphenyldiaminodiphenyl, tetraphenylenediamine and diphenylphenylenediamine, aromatic amine compounds, such as poly(vinylcarbazole), fullerene (carbon clusters represented by $C_{60}$), alkali metal complexes and alkaline earth metal complexes.

In the case of fullerene, a polyacene thin film may be produced by forming a thin film with a solution of an adduct of a polyacene (for instance, pentacene) with fullerene and then subjecting the adduct to thermal decomposition.

In addition, the acceptor molecules include halogens, such as iodine, bromine, chlorine, iodine chloride and iodine bromide, sulfur oxides, such as sulfuric anhydride, sulfur dioxide, sulfuric acid and sulfate, nitric oxides, such as nitric acid, nitride and nitrogen dioxide, halogenated compounds, such as perchloric acid and hypochlorous acid, acids and salts, such as tetrafluoroboric acid, tetrafluoroborate, phosphoric acid and phosphate, organic compounds, such as tetracyano quinodimethan, tetrachlorotetracyano quinodimethan, tetrafluorotetraquinodimethan, tetracyanoethylene, dichlorodicyanoquinone and tetrachloroquinone, carbon dioxide and oxygen.

These donor molecules and acceptor molecules may be each used alone or in a combination of two or more thereof. When mixed, however, donor molecules and acceptor molecules will form complexes, resulting in a reduction in the solubility of the polyacene.

Preferably, the content of donor molecules and acceptor molecules (these are generally referred to as dopants) in a solution for organic semiconductor should be equal to or less than 10% by mass. If the content thereof exceeds 10% by mass, this may result in an excess of dopant remaining in the organic semiconductor thin film, causing carrier defects due to the dopant.

A polyacene is a p-type semiconductor in undoped condition in the atmosphere, and a hole becomes a carrier. However, since these carriers are few, the devices using undoped thin films tend to be highly resistive and limit the operating condition and the device structure.

Thus, it is desirable, for the performance and the structure of a device, to introduce dopants and adjust carrier types and density. Because acceptor molecules further increase hole carriers in a polyacene thin film (organic semiconductor thin film) containing acceptor molecules, a device with low resistance, high gain and high current can be formed.

On the other hand, in a polyacene thin film containing donor molecules, hole carriers decrease with an increase in the content of donor molecules, and electron carriers increase. Because it is possible to change a semiconductor among the p-type, the i-type and the n-type by adjusting the content of donor molecules in this process, using the semiconductor as an i-type or n-type semiconductor and preparing various kinds of semiconductor device structures, such as the p-i-n structure, p-n structure, n-p-n structure and p-n-p structure, is possible.

The organic semiconductor thin films of the present invention are explained in the following paragraphs.

The organic semiconductor thin films of the present invention can be obtained by coating the above-mentioned solution for organic semiconductors on a substrate and vaporizing the solvent by means of heating and so forth. The methods for coating the solution for organic semiconductor on a substrate include application, spraying as well as a method of allowing the substrate to come in contact with the solution for organic semiconductors. Specifically, such methods include known methods such as spin coating, dip coating, screen printing, ink jet printing, blade application, lithography, intaglio printing and letterpress printing.

These methods can be performed under ordinary atmospheric conditions or in an atmosphere of inert gases such as nitrogen and argon. However, the preparation and preservation of polyacene solutions and the forming of organic semiconductor thin films should be performed in an inert gas atmosphere because the solution of some polyacenes is likely to be oxidized.

In addition, when the solvent is vaporized, crystal growth can be controlled by regulating the solvent gasification rate at the gas-liquid interface by means of the temperature near the substrate and the solvent vapor pressure in the atmosphere. In addition, it is possible to form an organic semiconductor thin film on a substrate by bringing the substrate in contact with a solution for organic semiconductors and placing the substrate in a supersaturation state. Furthermore, as required, crystal growth can be controlled by applying, to the interface between the solution for organic semiconductors and the substrate, at least one of: temperature gradient, electric field and magnetic field. These methods can be used to form an organic semiconductor thin film having high crystallinity. The resultant organic semiconductor thin film has superior characteristics as a semiconductor due to high crystallinity.

Furthermore, it is preferable that the amount of solvent remaining in an organic semiconductor thin film be small considering the stability and semiconducting characteristics of the organic semiconductor thin film. Consequently, it is generally desirable to remove almost completely the solvent remaining in the organic semiconductor thin film by re-treating with heat and/or reduced pressure after forming the organic semiconductor thin film.

Furthermore, in the organic semiconductor thin film of the present invention, formed crystals tend to have polyacene molecules with their long-axis perpendicular to the face of the substrate. This suggests that polyacenes have high intermolecular cohesive force and molecular columns stacked between molecular faces are likely to be formed. Therefore, the X-ray diffraction pattern of an organic semiconductor thin film tends to show high intensity of the (00n) plane of the crystal. In an organic semiconductor device comprising organic semiconductor thin films like this, carriers appear to tend to drift along the molecular columns mentioned above.

The organic semiconductor thin film of the present invention is characterized by high carrier mobility, and it is desirable that the carrier mobility be equal to or more than 0.01 $cm^2/V·s$ when used for organic semiconductor devices such as transistors. More preferably, the mobility is equal to or more than 0.03 $cm^2/V·s$, and most preferably equal to or more than 0.1 $cm^2/V·s$.

Furthermore, while the crystallinity of ordinary inorganic semiconductor thin films is affected by the crystallinity and plane direction of the substrate material, the present invention provides organic semiconductor thin films with high crystallinity regardless of the crystallinity and plane direction of the substrate material. Thus, various materials can be used for the substrate regardless of crystallinity and amorphous nature.

These various materials include ceramics, such as glass, quartz, aluminum oxide, sapphire, silicon nitride and silicon carbide, semiconductors of silicon, germanium, gallium arsenide, gallium phosphide, gallium nitride and so forth, resins, such as polyester (poly(ethylene terephthalate), poly(ethylene naphthalate)), polyethylene, polypropylene, poly(vinyl alcohol), ethylene vinyl alcohol copolymer, cyclic polyolefin, polyimide, polyamide, polystyrene, polycarbonate, polyethersulfone, polysulfone and poly(methyl methacrylate), paper and non-woven fabric.

Although the shape of the substrate is not particularly limited, a board type substrate is usually used.

Furthermore, in organic semiconductor thin films formed from a solution for organic semiconductors containin a dopant, part or all of the dopant may be removed during or after the formation of the organic semiconductor thin film.

For instance, after forming organic semiconductor thin films from a solution for organic semiconductors containing iodine, an acceptor molecule, iodine molecules may be removed from the organic semiconductor thin films by maintaining them at about 150° C. under a stream of inert gas.

Thus, adjusting the electronic characteristics of organic semiconductor thin films is possible by controlling the carrier density by adjusting the content of dopant in the organic semiconductor thin films. Alternatively, the dopant may be added (doping) after organic semiconductor thin films are formed if necessary.

These organic semiconductor thin films can provide useful semiconductor devices for electronics, photonics and bioelectronics.

These semiconductor devices include diodes, transistors, thin film transistors, memories, photo diodes, light emitting diodes, luminescent transistors and sensors.

Transistors and thin film transistors can be used in various kinds of display devices such as active-matrix drive system displays, liquid crystal displays, dispersed type liquid crystal displays, electrophoresis type displays, particle rotation type display devices, electrochromic displays, organic luminescence displays and electronic paper.

Transistors and thin film transistors can be used for transistors for switching pixels, signal driver circuit devices, memory circuit devices and signal processing circuit devices in these display devices.

Switching transistors for display devices are allocated to individual pixels of a display device, where the transistors perform switching of individual pixels. Because the patterning of facing electroconductive substrates is unnecessary for active drive devices like these, the pixel circuit can, depending on the circuit structure, be made simpler than that for passive drive devices, which do not have switching transistors for pixels. One to several switching transistors are usually allocated to each pixel. These display devices have a structure wherein data lines and gate lines, formed on the substrate face cross in a two-dimensional manner, and the data lines and the gate lines are each connected to the gate electrode, source electrode and drain electrode of a transistor. It is also possible to divide the data lines and gate lines or add current supply lines and signal lines.

It is also possible to add a facility to record signals by combining a capacitor with the pixels of a display device in addition to the pixel circuit and transistor. Furthermore, the substrate on which a display device has been formed, can carry drivers for a data lines and gate lines, a memory for pixel signals, a pulse generator, a signal splitter and a controller.

If the semiconductor device is a transistor, the device structure may be, for instance, a substrate/gate electrode/insulator layer (dielectric layer)/source electrode·drain electrode/semiconductor structure, a substrate/semiconductor/source electrode·drain electrode/insulator layer (dielectric layer)/gate electrode structure or a substrate/source (or drain) electrode/semiconductor+insulator layer (dielectric layer)+gate electrode/drain (or source) electrode structure. These structures can each have more than one source electrode, drain electrodes and gate electrodes. In addition, multiple semiconductor layers may be installed in the same plane, or laminated.

The configuration of the transistor can be either the MOS (metal-oxide (insulator layer)-semiconductor) type or the bipolar type. Because polyacenes normally provide p-type semiconductors, devices can be configured by combining with a polyacene that has been made an n-type semiconductor through donor doping or an n-type semiconductor other than polyacenes.

The device structure of a bipolar type transistor can be, for instance, a n-type semiconductor/p-type semiconductor/n-type semiconductor structure or a p-type semiconductor/n-type semiconductor/p-type semiconductor structure, and each semiconductor layer is connected to electrodes. The organic semiconductor thin film of the present invention is used for at least one of the p-type semiconductor layers.

The n-type semiconductors include metallic oxides such as tin oxide, zinc oxide, titanium oxide and indium oxide. In addition, addition products of amorphous silicon, crystalline silicon, polysilane, fullerene (carbon clusters such as $C_{60}$) and pentacene with fullerene, formed by Diels-Alder reaction, may be used. Furthermore, polymers such as polyaniline and polythiophene may be used.

In addition, if the semiconductor device is a diode, the device structure may be, for instance, an electrode/n-type semiconductor/p-type semiconductor/electrode structure. The organic semiconductor thin film of the present invention is used for the p-type semiconductor layer, and the above-mentioned n-type semiconductor is used for the n-type semiconductor layer.

At least part of the contact surface between the interior or surface of the organic semiconductor thin film and the electrode can be Schottky junction and/or tunnel junction. These junction structures may include an electrode/Schottky junction (tunnel junction)/semiconductor/electrode structure, an electrode/semiconductor/tunnel junction/semiconductor/electrode structure and an electrode/Schottky junction (tunnel junction)/semiconductor/tunnel junction/semiconductor/electrode structure.

These Schottky junctions and tunnel junctions may be used not only for the adjustment of diode characteristics and as tunnel junction devices but also for the production of high-performance devices by using magnetic, photoresponsive or dielectric material for the Schottky junctions and tunnel junctions.

In addition, a diode can be formed simply by applying a Schottky junction and/or a tunnel junction to a p-type semiconductor formed by using the organic semiconductor thin films of the present invention.

These organic semiconductor devices having such a junction structure are preferable in that diodes and transistors can be formed using simple configurations. Furthermore, multiple organic semiconductor devices having the junction structure can be connected to form devices such as inverters, oscillators, memories and sensors.

In addition, the organic semiconductor device of the present invention maybe used as arithmetic and memory devices for IC cards, smart cards and electronic tags. In these cases, the organic semiconductor device may be applied to either the contact or non-contact type of the card or tag without difficulty.

These IC cards, smart cards and electronic tags are composed of memories, pulse generators, signal splitters, controllers and capacitors, and may further comprise antennas and batteries.

Furthermore, the organic semiconductor devices of the present invention may be used as sensors, and can be applied to various sensors including gas sensors, biosensors, blood sensors, immuno-sensors, artificial retinas and taste sensors. Generally, objects of measurement are analyzed using changes in resistivity of the organic semiconductor thin film produced when the thin film composing an organic semiconductor device comes in contact with or near to the object.

Diodes, and devices with Schottky and/or tunnel junctions, that comprise the organic semiconductor devices of the present invention may be used as photo detectors, such as photoelectric transducers, solar batteries and infrared sensors, photodiodes and as light emitters. In addition, transistors comprising the organic semiconductor devices of the present invention may be used as light emitting transistors. Known organic or inorganic materials can be used in the light emitting layers of these light emitters.

The method for manufacturing the semiconductor devices mentioned above may comprise either forming a patterned organic semiconductor thin film by applying a solution for organic semiconductors to a given area of the electrode, semiconductor and insulator layer having preformed patterns, or first forming an organic semiconductor thin film then patterning and forming electrodes and insulator layers.

The patterning method for the organic semiconductor thin film may comprise a printing process, such as screen printing, gravure, offset printing, ink jet printing and spraying, using a solution for organic semiconductors as the ink. In addition, after forming a resist pattern or a mask layer on an organic semiconductor thin film, the organic semiconductor thin film may be etched using a polyacene-dissolving solvent or plasma. Furthermore, organic semiconductor devices may be laminated, or a protective or light shielding layer may be installed after forming an organic semiconductor device.

When a solution is used to form various electrodes, insulator layers, protective layers and so forth during the formation of a semiconductor device as described above, it is desirable that the polyacene-dissolving solvent not be in direct contact with the organic semiconductor thin film. Thus, when the polyacene-dissolving solvent is used, it is preferred that a barrier be installed to protect the organic semiconductor thin film from the solvent.

Semiconductor devices using the organic semiconductor thin films can be produced by forming organic semiconductor thin films on substrates such as glass and resin. Besides, a number of semiconductor devices can be easily formed at one time in a large area because organic semiconductor thin films can be formed by simple methods such as printing and application of solutions. Consequently, semiconductor devices and other devices (display devices, arithmetic devices, memory devices, etc. mentioned above) using these semiconductor devices can be produced at low cost. In addition, manufacturing semiconductor devices using organic semiconductor thin films can result in reductions in the thickness and weight of devices using semiconductor devices.

Here, examples of methods for manufacturing the aforementioned MOS type transistors by printing, application and so forth are described.

First, after forming a pattern for gate electrode on a substrate, patterns for insulator layer, source electrode and drain electrode are formed. Then semiconductor layers are formed on the gaps of the source and drain electrodes to form a transistor.

A transistor can also be obtained by first forming a semiconductor layer on the substrate and further forming patterns for source and drain electrodes, then forming patterns for insulator layer and gate electrode successively.

In addition, a semiconductor layer may be interposed between the source and drain electrodes to form a transistor with the three layers laminated along film thickness the vertical direction. In these cases, the gate electrode is preferably arranged in the semiconductor layer or near the source (or drain) electrode.

Because these electrodes, insulator layers and semiconductor layers constituting transistors can all be formed by printing, application and the like, transistors can be manufactured under atmospheric pressure and a vacuum environment is unnecessary.

Preferred electrode materials include metals, electroconductive ceramics, carbon and electroconductive organic materials. The material for electrodes must be liquid in order to form electrodes by printing, application and so forth. Thus a liquid material can be used independently as a material for electrodes, but a non-liquid material must be dispersed in other liquids prior to use. Examples are electroconductive pastes containing powders, such as those of gold, silver, copper, osmium, palladium, nickel, cobalt, iron and aluminum, that are dispersed in a liquid.

Alternatively, precursors may be used if they are liquid or can easily be made liquid. Examples are solutions of organic and inorganic metal complexes of gold, silver, nickel, etc.

It is desirable that the insulator layer material has a high dielectric constant, and insulating ceramics, organic compounds and polymers are used. These materials must also be liquid as with electrode materials, so solutions, dispersion products and precursors of these materials should be used. For instance, thin films are formed by applying or printing alcoholate or acetylacetonate complexes, or their solutions, and the thin films are converted into oxides or sulfides by radiation energy such as heat and light to form insulators. Polymers, such as poly(vinylidene fluoride), polyacrylonitrile, polyester and liquid crystal polymer, and polar organic compounds are also preferable materials. Highly dielectric materials such as ceramics may be dispersed into these organic compounds.

In addition, multiple printers and/or applicators arranged in a straight line will allow continuous printing and/or application of organic semiconductor solutions to a continuous sheet. Thus, organic semiconductor devices can be manufactured so that electrodes, dielectric layers and semiconductor layers are arranged continuously on a sheet.

For instance, when manufacturing a transistor having the device structure of substrate/gate electrode/insulator layer (dielectric layer)/source electrode and drain electrode/semiconductor layer, a strip substrate is passed through a line comprising a gate electrode printer, insulator layer printer, source and drain electrode printer and semiconductor layer printer, thus forming the transistor components in a continuous manner.

Such a continuous transistor manufacturing method has several advantages; low equipment load, short process, significantly decreased workers and low cost. In addition, since a number of thin film transistors can be easily formed on a large-area substrate at one time, large-size displays can be manufactured at low cost.

Known printing and application methods may be used, such as screen printing, gravure, offset printing, ink jet printing, spraying and blade application. Multiple printers and/or applicators may employ the same printing and application methods or employ different methods according to the components.

In the lower portion of such a continuous transistor manufacturing line, an instrument for vaporizing solvent or an instrument for controlling the crystal growth of the polyacene may be installed as required.

Using a roll type strip substrate and feeding the substrate to printers and/or applicators successively may decrease the space required for equipment. Ease of continuous feeding of the substrate may improve the speed of manufacturing transistors. Preferred substrate materials include poly(ethylene terephthalate), polypropylene, polycarbonate, polyether sulfone and poly(methyl methacrylate) resins.

Furthermore, the aforementioned continuous transistor manufacturing line may carry, as required, a protective layer printer, a gas barrier layer printer, a transparent electrode printer, etc., so that semiconductor devices of advanced configuration (for instance, substrate with thin film transistors for displays) can be manufactured at low cost and high speed.

The continuous transistor manufacturing method will be described by reference to FIG. 1. FIG. 1 is a conceptual drawing showing a transistor manufacturing system comprising linearly arranged printers.

Strip substrate 12, delivered from delivery roll 6, is fed to gate electrode printing roll 7 to print a gate electrode pattern. The substrate 12 is successively passed to dielectric layer printing roll 8, source and drain electrode printing roll 9 and semiconductor layer printing roll 10 to print respectively dielectric layer, source electrode, drain electrode and semiconductor layer patterns. Thus, a transistor having a gate electrode/dielectric layer/source and drain electrodes/semiconductor layer structure is formed on substrate 12, which is wound on take-up roll 11.

When manufacturing semiconductor devices by printing, application, etc., solvents may sometimes be used to dissolve the components, i.e. electrodes, insulator layers and semiconductor layers. If these layers are laid on a preformed layer below, then the solubility of the solvent used and the swelling property of the lower layer material will become problems because the solvent used will touch the lower layer. Hence, the type of solvent used must be determined by considering these matters.

A wall as thick as the thin film may be installed on the side of the thin film formed by printing, application and the like to make the thin film faces flat. Walls thus formed are useful to prevent short circuits between electrodes. Layers of uniform thickness are easily formed because the difference in level between laminas is minimized.

The patterns formed on a substrate may be removed and transcribed to other substrates. It is also possible to form semiconductor devices or circuits on both sides of a substrate as well as to form an interconnect between lamination layers.

BEST MODE FOR CARRYING OUT THE INVENTION

Solutions for organic semiconductors, organic semiconductor thin films, organic semiconductor devices and the manufacturing methods thereof in accordance with the present invention are described in detail below with reference to the drawings.

These embodiments are presented for illustrative purposes only and are not intended to limit the present invention.

First, organic semiconductor thin films formed with unsubstituted polyacenes (polyacenes, hydrogen atoms of which are not substituted with other functional groups) and organic semiconductor devices using the organic semiconductor thin films are described below.

EXAMPLE 1

Figure 1:
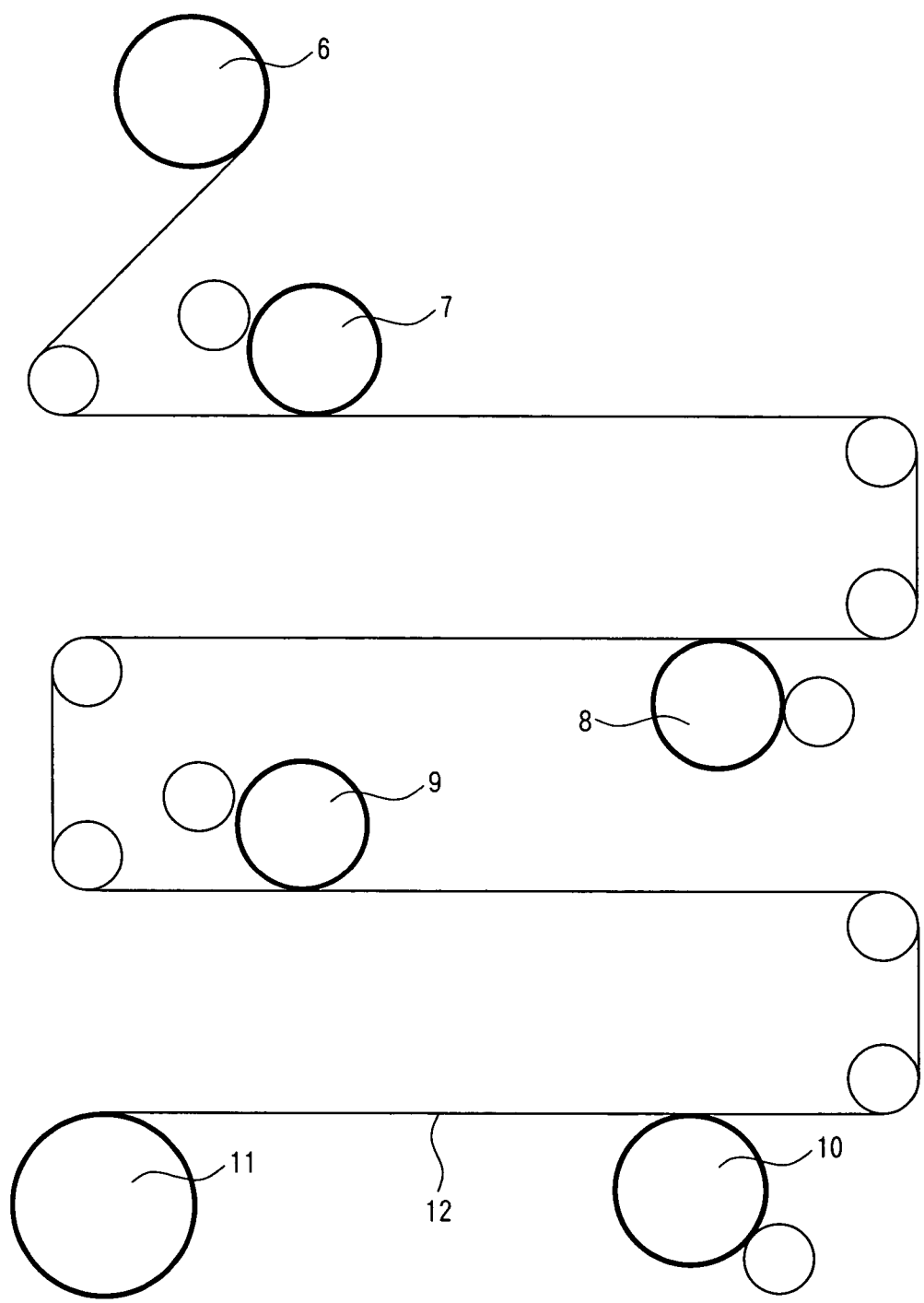
FIG. 1 is a conceptual drawing showing a transistor manufacturing system comprising linearly arranged printers.
Figure 2:
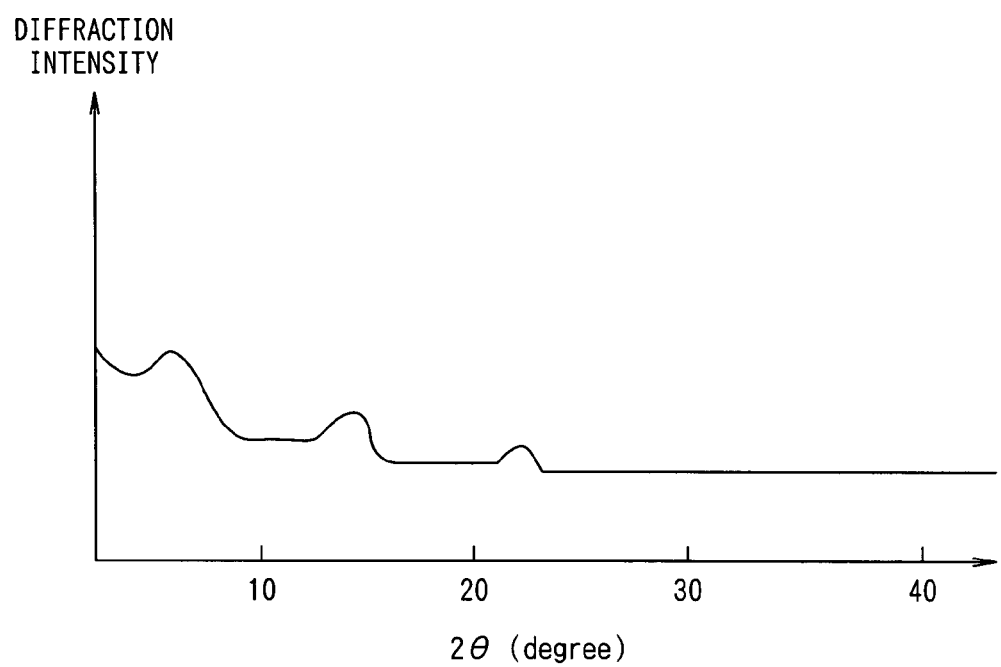
FIG. 2 is an X-ray diffraction pattern of a naphthacene thin film.

Naphthacene was dissolved in o-dichlorobenzene to prepare a solution (5% by mass) of naphthacene. The solution was cast onto a glass substrate and dried, and a thin film 350 nm thick was prepared. The X-ray diffraction pattern (CuKαray) revealed peaks of the (00n) plane (n=1, 2 and 3) with a c-axis lattice constant of 1.3 nm (see FIG. 2), indicating a crystalline thin film.

EXAMPLE 2

Figure 3:
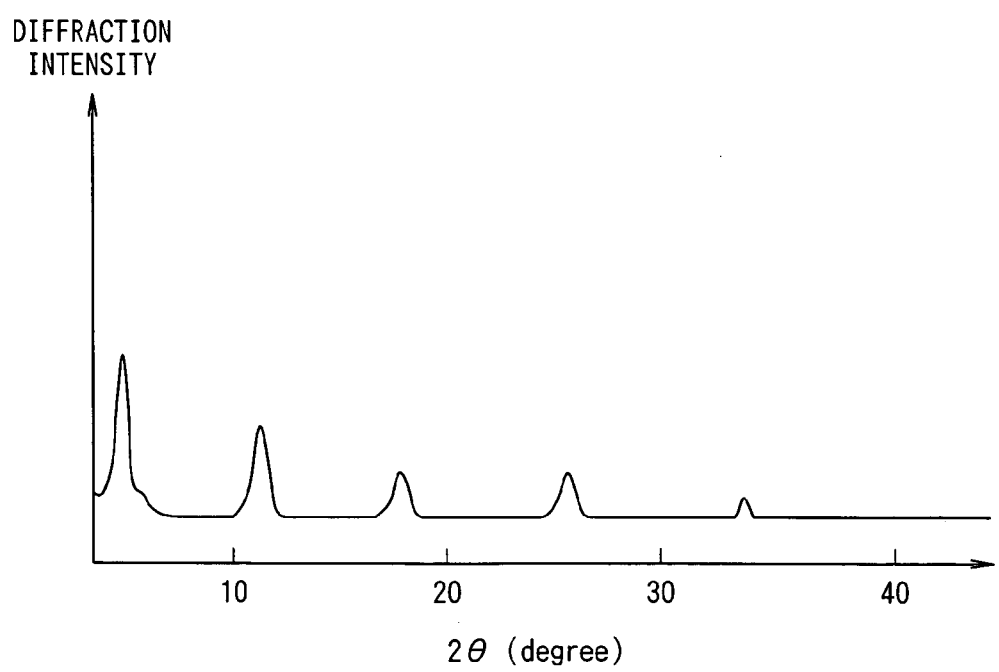
FIG. 3 is an X-ray diffraction pattern of a pentacene thin film.

Pentacene was dissolved in o-dichlorobenzene to prepare a solution (0.05% by mass) of pentacene. The solution was applied several times onto a glass substrate and dried, and a thin film 90 nm thick was prepared. X-ray diffraction was performed as in Example 1, and the X-ray diffraction pattern revealed peaks of the (00n) plane (n=1, 2, 3, 4 and 5) with a c-axis lattice constant of 1.5 nm (see FIG. 3), indicating a crystalline thin film.

EXAMPLE 3

For hexacene, the method in literature (Minakata et al., Polymer Advanced Technology, 5, p602 (1995)) was employed. In short, naphthalene dialdehyde was reacted with anthracene dihydroquinone in ethanol in the presence of alkali to prepare dihydroxyhexacenequinone. The dihydroxyhexacenequinone was reduced by lithium aluminum hydride to synthesize dihydrohexacene, and the dihydrohexacene was dehydrogenated by copper (I) oxide in the presence of palladium catalyst to produce hexacene. Then, crystalline powder of hexacene was obtained by sublimation purification.

The hexacene thus prepared was dissolved in o-dichlorobenzene to prepare a solution (0.05% by mass) of hexacene. In an inert atmosphere, the solution was applied several times onto a glass substrate and dried, and a thin film was prepared. X-ray diffraction was performed as in Example 1, and the X-ray diffraction pattern revealed peaks of the (00n) plane (n=2 and 3) with a lattice constant of 1.8 nm, indicating a crystalline thin film.

EXAMPLES 4 TO 9 AND COMPARATIVE EXAMPLES 1 TO 4

As in Example 1, polyacenes were dissolved in various solvents to prepare solutions and thin films were formed from these solutions. Then the X-ray diffraction patterns of the thin films were determined. The types of polyacenes and solvents, the concentrations of solutions, and the thickness and crystallinity of thin films are summarized in Table 1.

As shown in Table 1, thin films with crystallinity of c-axis orientation were obtained in Examples 4 to 9 as in Examples 1 to 3. In contrast, in Comparative Examples 1 to 4, the solubility of polyacenes in solvents used was so low that the polyacenes were scarcely dissolved, resulting in a failure to obtain thin films. The figure "<0.01" denotes concentrations of polyacene of less than 0.01% by mass.

EXAMPLE 5

Pentacene was dissolved in o-dichlorobenzene containing 3% (by mass) iodine to prepare a solution (pentacene 0.08% by mass, iodine 3% by mass, o-dichlorobenzene 96.92% by mass). The solution was applied onto a glass substrate and dried as in Example 2, and a thin film 150 nm thick was prepared. X-ray diffraction was performed as above, and the X-ray diffraction pattern of the thin film revealed peaks of the (00n) plane (n=1 to 8) with a c-axis lattice constant of 1.9 nm, indicating a crystalline thin film.

This thin film was reddish in color and iodine was included as dopant, as revealed by absorbance at 320 nm and 500 nm in visible spectroscopy.

Similarly, a pentacene thin film like this was formed on a glass substrate on which gold electrodes were preformed by vapor deposition. The electric conductivity of the pentacene thin film determined from resistance between electrodes was 0.1 S/cm (1/ohm·cm).

EXAMPLE 6

The pentacene thin film containing iodide prepared in Example 5 was heated at 150° C. for 10 minutes in an inert gas stream. X-ray diffraction was performed on the pentacene thin film after heating, and the X-ray diffraction pattern revealed peaks of the (00n) plane (n=2 to 6) with a c-axis lattice constant of 1.5 nm, indicating crystals similar to the pentacene thin film prepared in Example 2. The pentacene thin film after heating was blue in color, and iodine was found to be lost from the thin film since visible spectroscopy revealed that the absorption derived from iodine disappeared.

The pentacene thin film, prepared in Example 5, that was formed on a glass substrate on which gold electrodes were preformed by vapor deposition was heated in the same way as above. After thus eliminating iodine from the thin film, the electric conductivity of the thin film was $10^{-4}$ S/cm.

EXAMPLE 7

Metal lithium was dispersed in a 3% (by mass) solution of butyllithium in a mixture of tetrahydrofuran (THF) and toluene (10:90) in an inert atmosphere and pentacene powder was added to prepare a solution of pentacene. The

TABLE 1

| | Polyacenes | | | Thickness of organic | |
| | Type | Concentration (% by mass) | Solvents | semi-conductor thin film (nm) | Crystallinity of organic semiconductor thin film |
|---|---|---|---|---|---|
| Example 4 | tetracene | 1.5 | chloroform | 600 | crystallinity, c-axis orientation |
| Example 5 | tetracene | 0.4 | toluene | 200 | crystallinity, c-axis orientation |
| Example 6 | tetracene | 0.2 | mesitylene | 100 | crystallinity, c-axis orientation |
| Example 7 | tetracene | 0.08 | propylene carbonate | 80 | crystallinity, c-axis orientation |
| Example 8 | tetracene | 0.05 | γ-butyrolactone | 50 | crystallinity, c-axis orientation |
| Example 9 | pentacene | 0.09 | chloroform | 120 | crystallinity, c-axis orientation |
| Comparative Example 1 | tetracene | <0.01 | n-Propanol | — | — |
| Comparative Example 2 | tetracene | <0.01 | diethyl ether | — | — |
| Comparative Example 3 | tetracene | <0.01 | ethyl acetate | — | — |
| Comparative Example 4 | pentacene | <0.01 | cyclohexane | — | — | resultant solution was filtered to separate undissolved pentacene powder and metal lithium. The undissolved matter was washed with methanol to dissolve only the metal lithium and the remaining pentacene powder was dried and weighed. As a result, the concentration of the solution of pentacene was found to be 0.06% by mass.

The solution of pentacene thus prepared was applied onto a glass substrate in an inert gas stream and dried, and a thin film 20.6 nm thick was prepared. The electric conductivity of the thin film, determined in the same way as Example 5, was 0.002 S/cm. The result showed that metal lithium or butyllithium served as a dopant and decreased resistance.

EXAMPLE 8

Figure 4:
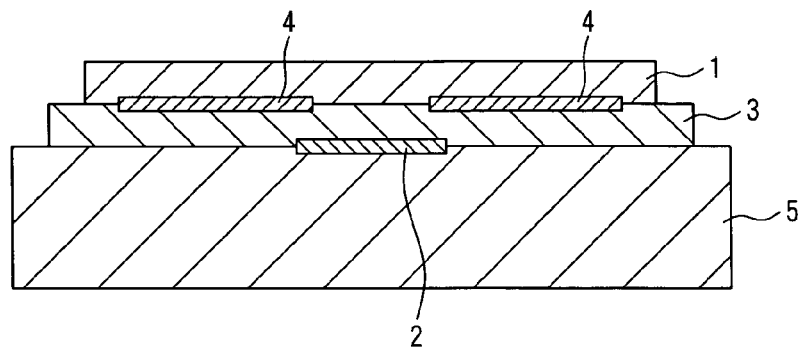
FIG. 4 is a cross-sectional view showing the structure of a field effect transistor that is an embodiment of the invention organic semiconductor device.

A field effect transistor, an embodiment of the organic semiconductor device of the present invention, is described with reference to FIG. 4.

A gate electrode 2, formed by patterning using gold thin film from electron beam vapor deposition, an insulator layer 3, formed by patterning using sputtered $SiO_2$ by reactive ion etching (RIE) , and source and drain electrodes 4 and 4, formed by patterning using gold thin film of electron beam vapor deposition, were successively laminated onto a glass substrate 5. Then, the solution of pentacene of Example 2 was applied onto the glass substrate and dried, to form an organic semiconductor thin film 1, and a transistor was thus fabricated.

Figure 5:
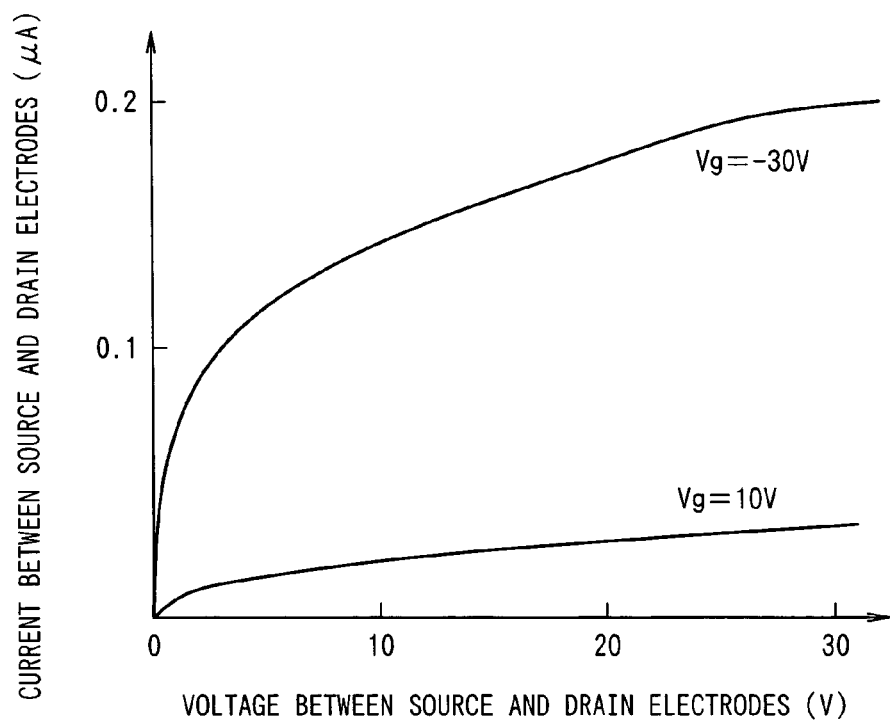
FIG. 5 is a current/voltage curve of a field effect transistor.

The voltage and current between the source and drain electrodes at gate voltages of 10 V and −30V were determined (see the current/voltage curve in FIG. 5). Results showed that the on/off current ratio was $10^5$ and mobility was 0.2 cm$^2$/V·s, indicating that the transistor was a field effect transistor.

EXAMPLE 9

A transistor was prepared according to the same steps of Example 8 except that a poly(ethylene terephthalate) film was used as the substrate and the solution of Example 5 was used as the solution for organic semiconductor. The transistor was heated at 120° C. for 10 minutes.

As in Example 8, determination of the voltage and current between the source and drain electrodes was performed on the transistor thus obtained, and results showed that the on/off current ratio was $10^5$ and mobility was 0.2 cm$^2$/V·s.

Next, organic semiconductor thin films composed of substituted polyacenes (polyacenes in which at least one of the hydrogen atoms bound to aromatic rings is substituted by other functional group) and organic semiconductor devices comprising these organic semiconductor thin films are described below. First, the method for synthesizing substituted polyacenes is described.

The 2,3,9,10-tetramethylpentacene was synthesized in the same way as that in literature (Journal of American Chemical Society, 114, p1388 (1992)) except that benzenetetraaldehyde was used in place of benzenedifuran.

The 2,3,9,10-tetrahexylpentacene was synthesized in the same way as that in literature (Organic Letters, 2, p85 (2000)).

The 2,3,9,10-tetrabutylpentacene was synthesized in almost the same way as that for 2,3,9,10-tetrahexylpentacene above except that n-butyllithium was used in place of n-hexyllithium.

The 2,3,9,10-tetrapropylpentacene was synthesized in almost the same way as that for 2,3,9,10-tetrahexylpentacene above except that n-propylmagnesium bromide was used in place of n-hexyllithium.

The 5,7,12,14-tetrafluoropentacene was synthesized by reducing pentacenetron and further subjecting to sylation and fluorination.

The 2,3-bis(triisopropylsilylethynyl)pentacene was synthesized in the same way as that in literature (Organic Letters, 2, p85 (2000)).

The 2,3-difluoropentacenen was synthesized by fluorination of 2,3-dibromopentacene obtained in the middle of the synthesis of 2,3-bis(triisopropylsilylethynyl)pentacene.

The 6,13-bis(triisopropylsilylethynyl)pentacene was synthesized through Grignard reaction of 6,13-pentacenequinone, n-propylmagnesium chloride and triisopropylsilylacetylene.

The 6,13-diphenylpentacene was synthesized through Grignard reaction of 6,13-pentacenequinone and phenylmagnesium bromide.

The 5,7,12,14-tetraphenylpentacene was synthesized through Grignard reaction of 5,7,12,14-pentacenetetron and phenylmagnesium bromide.

The 6,13-bis(trimethylsilyldiethynyl)pentacene was synthesized using 6,13-pentacenenquinone as the starting material. That is, 6,13-pentacenequinone, n-propylmagnesium chloride and triisopropylsilylacetylene were allowed to react to give 6,13-bis(triisopropylsilylethynyl)pentacene, which was brominated and reacted with trimethylsilylacetylene.

A compound of pentacene in which tetrachlorobenzene was added to the central ring was synthesized by reference to literature (Advanced Materials, 11, p480 (1999)).

EXAMPLE 10

A solution of 0.3% by mass of 2,3,9,10-tetramethylpentacene synthesized as described above was prepared by dissolving the same in mesitylene in a nitrogen atmosphere. This solution was spin-coated (at a rotational speed of 1,000 rpm for 15 seconds) on a 2-inch silicon wafer, and then mesitylene was evaporated to obtain a thin film having a thickness of 120 nm.

Figure 6:
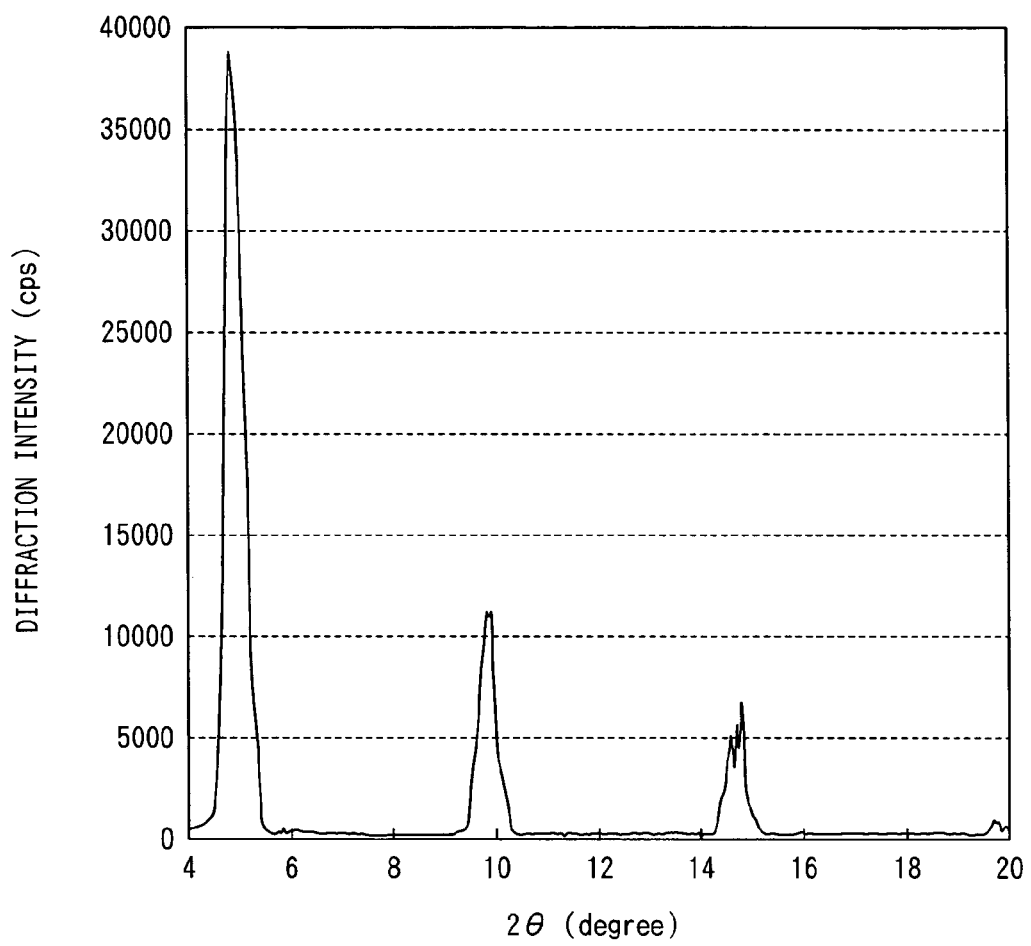
FIG. 6 is an X-ray diffraction pattern of a tetramethylpentacene thin film.

As a result of evaluating the structure of the obtained thin film by X-ray diffraction, diffraction peaks (planes (001), (002) and (003)) having an interplanar spacing of 1.8 nm were observed (refer to FIG. 6). The fact that the interplanar spacing corresponds to the major axis length of the molecule showed that 2,3,9,10-tetramethylpentacene was crystallized with the major axis of the molecule oriented perpendicular to the substrate surface.

In addition, a gold thin film having a thickness of 50 nm was formed by the electron beam vapor deposition process on an n-type silicon substrate with a thermally oxidized film having a thickness of 200 nm formed on the surface. Then, the surface of the gold thin film was applied with a resist (OFPR-80 made by Tokyo Ohka Kogyo Co., Ltd.), exposed, patterned, and then subjected to aqua regia etching to form an electrode pattern. The surface with the electrode pattern was spin-coated with the above described tetramethylpentacene solution to form a thin film having a thickness of 120 nm. In this manner, a field-effect transistor was formed, in which the gold electrodes are used as the source and drain electrodes and the silicon substrate is used as the gate electrode.

Figure 7:
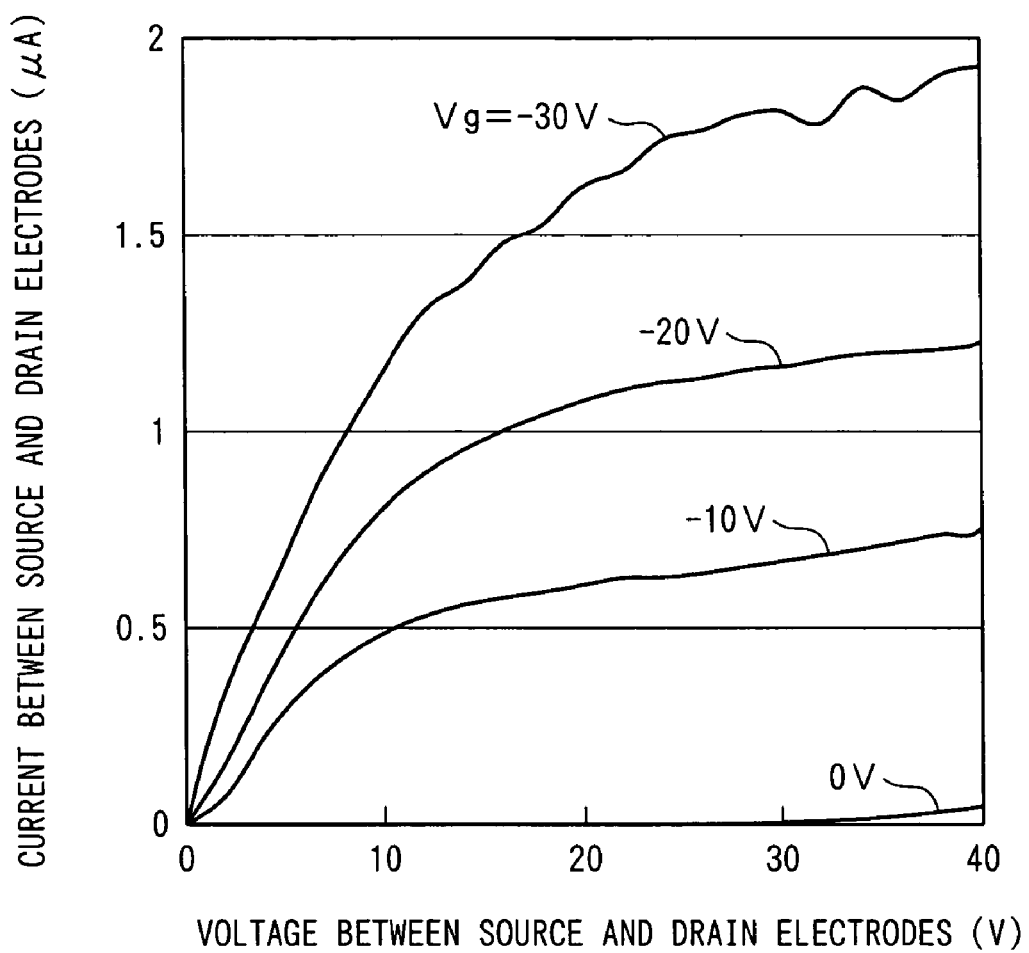
FIG. 7 is a current/voltage curve of a transistor using tetramethylpentacene thin films.

The electrode contact for the source and drain electrodes was checked by scraping the tetramethylpentacene film coated on the electrode surface by operating a tungsten needle with a prober. The gate voltage was changed from 10 V to −40 V in steps of 10 V and the drain voltage was changed from 0 V to −40 V to measure the voltage between the source and drain electrodes and the current between the source and drain electrodes (refer to FIG. 7). As a result, the saturation of the current was observed, and the carrier mobility determined from the saturation region was 0.35 $cm^2/V \cdot s$.

EXAMPLE 11

A solution of 1% by mass of 2,3,9,10-tetrahexylpentacene synthesized as described above was prepared by dissolving the same in toluene in a nitrogen atmosphere. This solution was spin-coated (at a rotational speed of 2,500 rpm for 15 seconds) on a silicon wafer, and then toluene was evaporated to obtain a thin film having a thickness of 210 nm.

Figure 8:
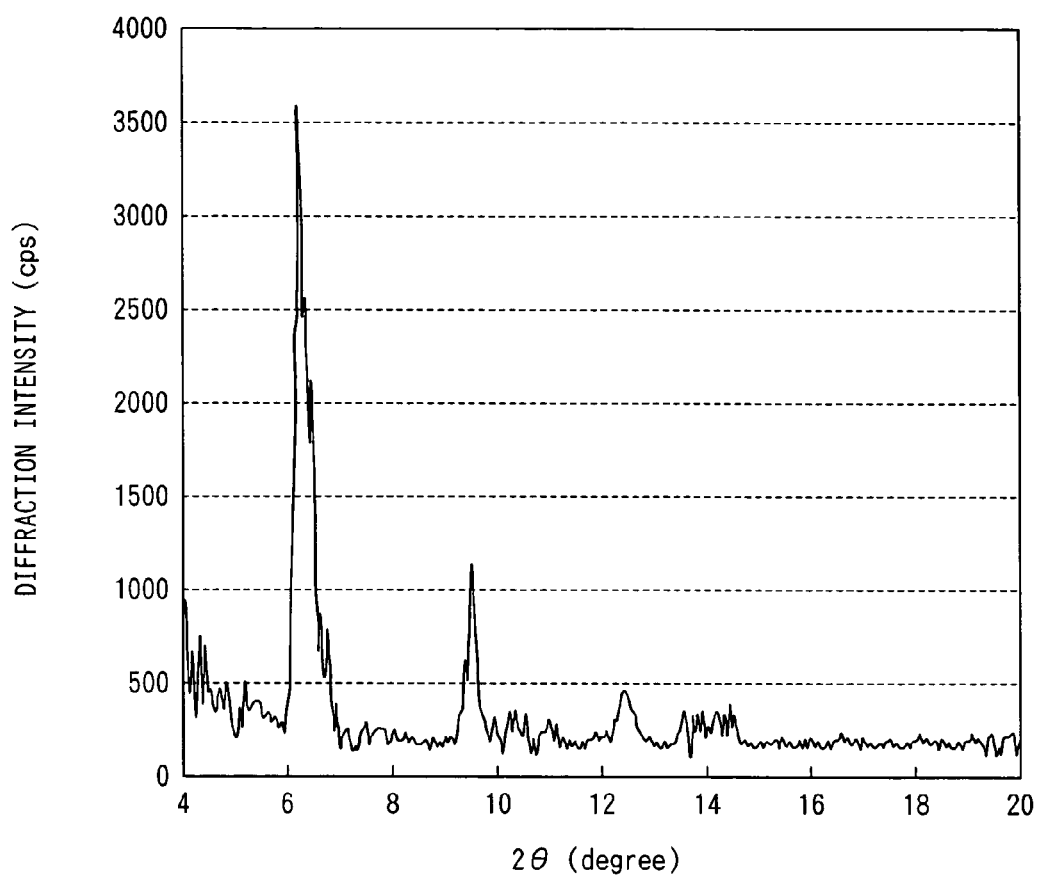
FIG. 8 is an X-ray diffraction pattern of a tetrahexylpentacene thin film.

As a result of evaluating the structure of the obtained thin film by X-ray diffraction, diffraction peaks (planes (002), (003) and (004)) having an interplanar spacing of 2.9 nm were observed (refer to FIG. 8). The fact that the interplanar spacing corresponds to the major axis length of the molecule showed that 2,3,9,10-tetrahexylpentacene was crystallized with the major axis of the molecule oriented perpendicular to the substrate surface.

In addition, in the same manner as in Example 10, an electrode pattern of a gold thin film was formed on the surface of an n-type silicon substrate with a thermally oxidized film formed thereon. Then, the surface with the electrode pattern was spin-coated with the above described tetrahexylpentacene solution to form a thin film having a thickness of 220 nm.

Figure 9:
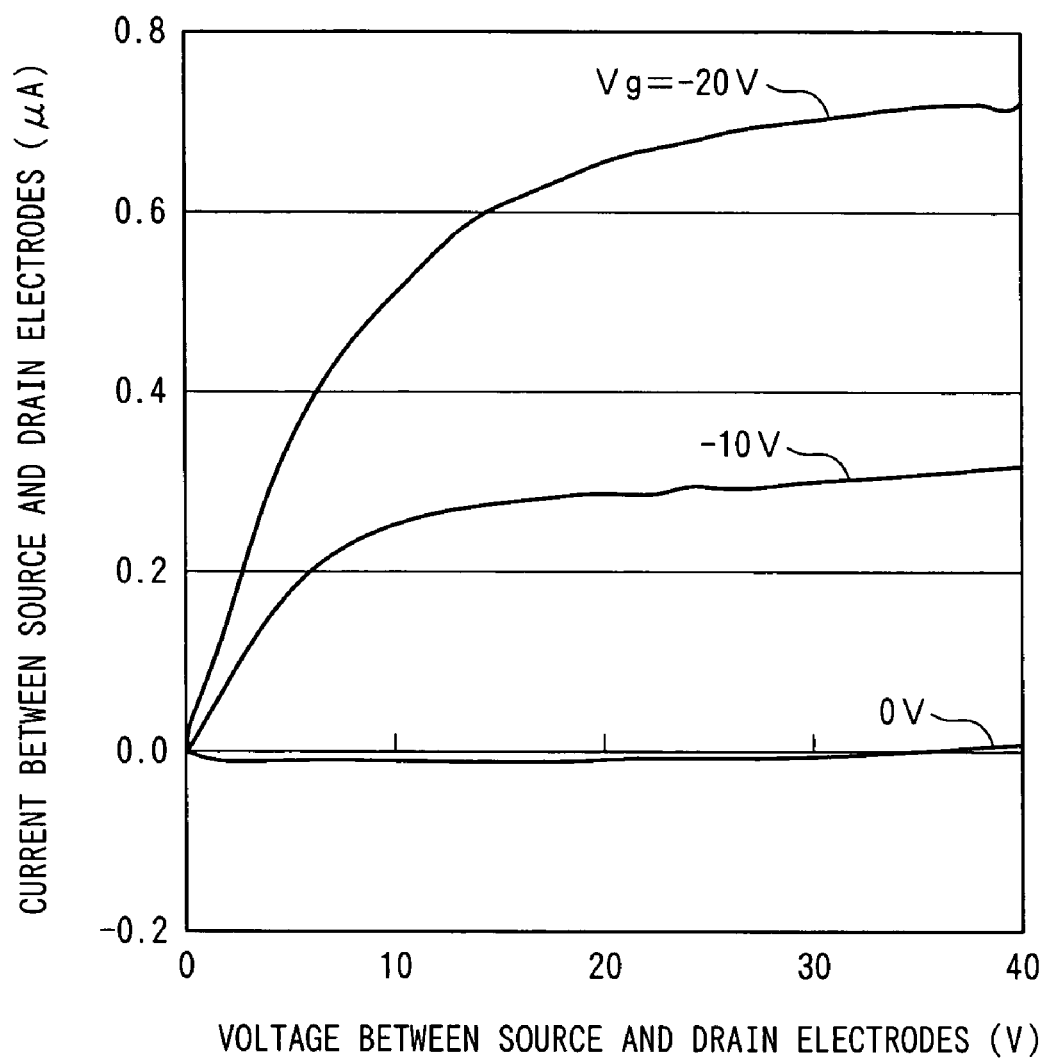
FIG. 9 is a current/voltage curve of a transistor using tetrahexylpentacene thin films.

For such a field effect transistor, the voltage between the source and drain electrodes and the current between the source and drain electrodes were measured in the same manner as in Example 10 (refer to FIG. 9). As a result, the saturation of the current was observed, and the carrier mobility determined from the saturation region was 0.08 $cm^2/V \cdot s$.

EXAMPLE 12

A solution of 1% by mass of 2,3,9,10-tetrabutylpentacene synthesized as described above was prepared by dissolving the same in mesitylene in a nitrogen atmosphere. This solution was dip-coated on a silicon substrate having an oxidized surface, and then mesitylene was evaporated to obtain a thin film having a thickness of 50 nm.

Figure 10:
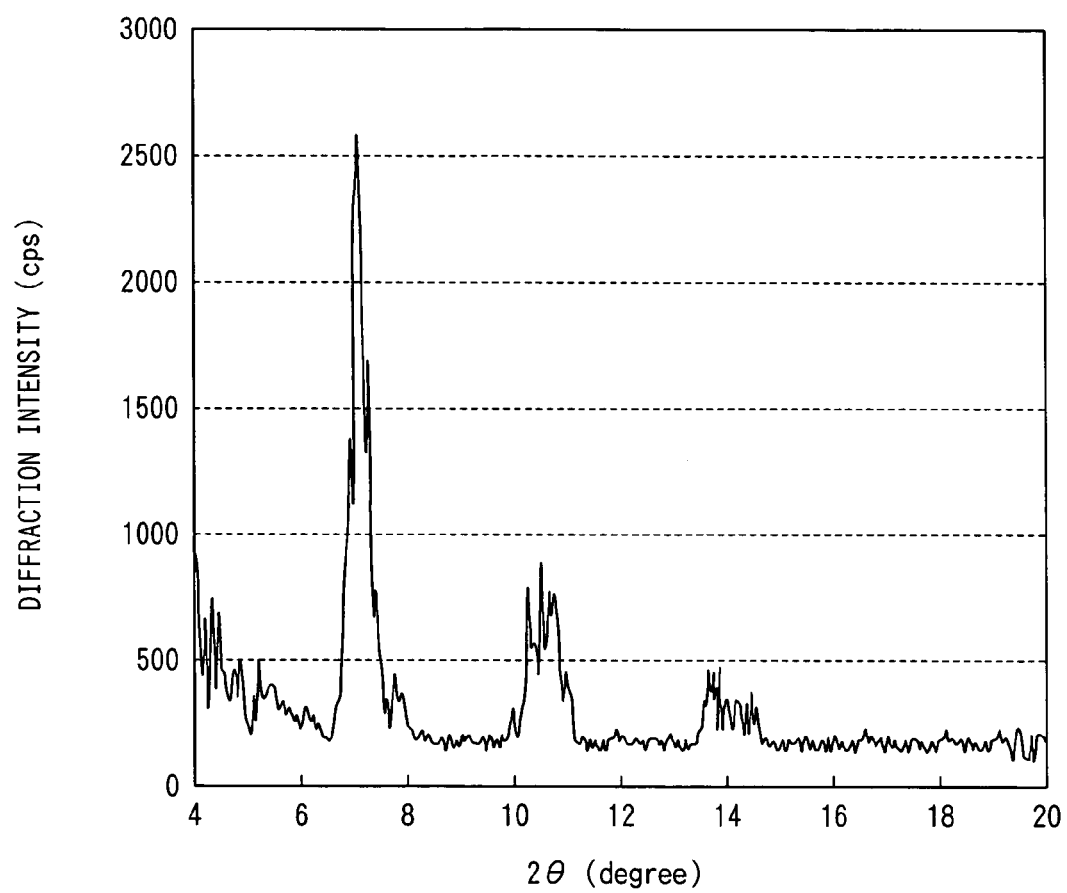
FIG. 10 is an X-ray diffraction pattern of a tetrabutylpentacene thin film.

As a result of evaluating the structure of the obtained thin film by X-ray diffraction, diffraction peaks (planes (002), (003) and (004)) having an interplanar spacing of 2.5 nm were observed (refer to FIG. 10). The fact that the interplanar spacing corresponds to the major axis length of the molecule showed that 2,3,9,10-tetrabutylpentacene was crystallized with the major axis of the molecule oriented perpendicular to the substrate surface.

In addition, in the same manner as in Example 10, an eltectrode pattern of a gold thin film was formed on the surface of an n-type silicon substrate with a thermally oxidized film formed thereon. Then, the surface with the electrode pattern was dip-coated with the above described tetrabutylpentacene solution to form a thin film having a thickness of 50 nm.

For such a field effect transistor, the voltage between the source and drain electrodes and the current between the source and drain electrodes were measured in the same manner as in Example 10. As a result, the saturation of the current was observed, and the carrier mobility determined from the saturation region was 0.28 $cm^2/V \cdot s$.

EXAMPLE 13

A solution of 1% by mass of 2,3,9,10-tetrapropylpentacene synthesized as described above was prepared by dissolving the same in mesitylene in a nitrogen atmosphere. This solution was spin-coated (at a rotational speed of 3,000 rpm for 10 seconds) on a silicon substrate having an oxidized surface, and then mesitylene was evaporated to obtain a thin film having a thickness of 80 nm.

Figure 11:
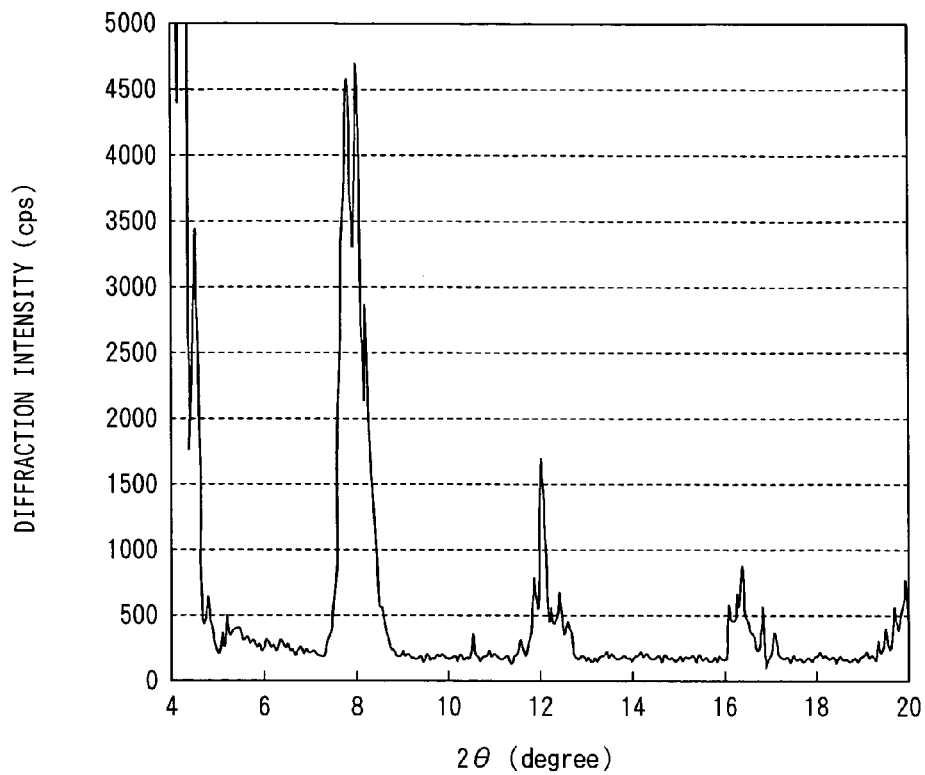
FIG. 11 is an X-ray diffraction pattern of a tetrapropylpentacene thin film.

As a result of evaluating the structure of the obtained thin film by X-ray diffraction, diffraction peaks (planes (001), (002), (003), and (004)) having an interplanar spacing of 2.1 nm were observed (refer to FIG. 11). The fact that the interplanar spacing corresponds to the major axis length of the molecule showed that 2,3,9,10-tetrapropylpentacene was crystallized with the major axis of the molecule oriented perpendicular to the substrate surface.

In addition, in the same manner as in Example 10, an electrode pattern of a gold thin film was formed on the surface of an n-type silicon substrate with a thermally oxidized film formed thereon. Then, the surface with the electrode pattern was spin-coated with the above described tetrapropylpentacene solution to form a thin film having a thickness of 90 nm.

Figure 12:
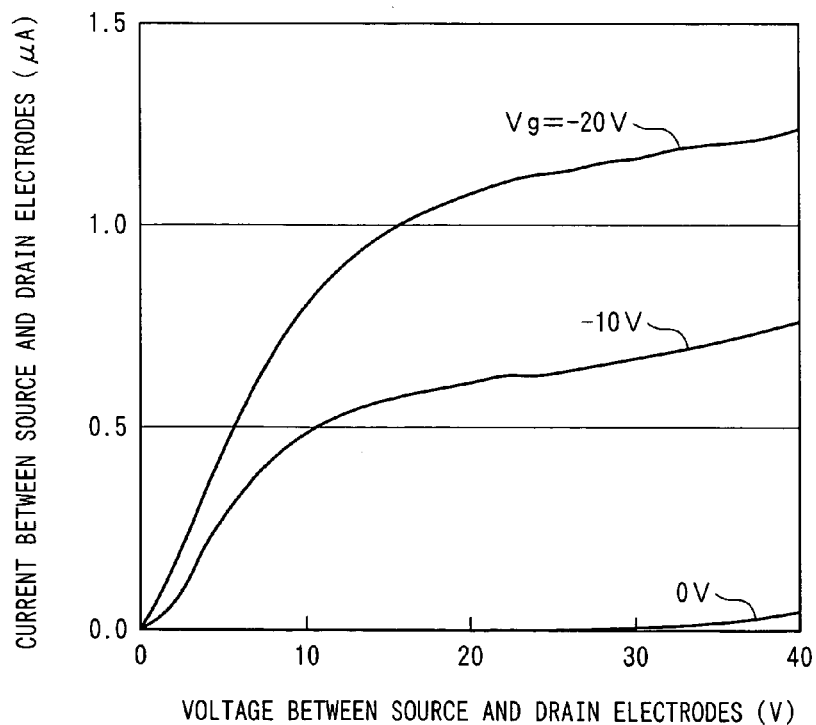
FIG. 12 is a current/voltage curve of a transistor using tetrapropylpentacene thin films.

For such a field effect transistor, the voltage between the source and drain electrodes and the current between the source and drain electrodes were measured in the same manner as in Example 10 (refer to FIG. 12). As a result, the saturation of the current was observed, and the carrier mobility determined from the saturation region was 0.35 $cm^2/V \cdot s$.

EXAMPLE 14

A solution of 1% by mass of 5,7,12,14-tetrafluoropentacene synthesized as described above was prepared by dissolving the same in o-dichlorobenzene in a nitrogen atmosphere. This solution was spin-coated (at a rotational speed of 500 rpm for 15 seconds) on a polyester film (having a thickness of 88 μm) adhered to a silicon substrate, and then o-dichlorobenzene was evaporated to obtain a thin film having a thickness of 60 nm.

A field effect transistor was formed in the same manner as in Example 10, and the voltage between the source and drain electrodes and the current between the source and drain electrodes were measured. As a result, the saturation of the current was observed, and the carrier mobility determined from the saturation region was 0.05 $cm^2/V \cdot s$.

EXAMPLE 15

A solution of 0.5% by mass of 2,3-bis(triisopropylsilylethynyl)pentacene synthesized as described above was prepared by dissolving the same in toluene in a nitrogen atmosphere. This solution was spin-coated (at a rotational speed of 3,000 rpm for 10 seconds) on a glass substrate, and then toluene was evaporated to obtain a thin film having a thickness of 550 nm.

Figure 13:
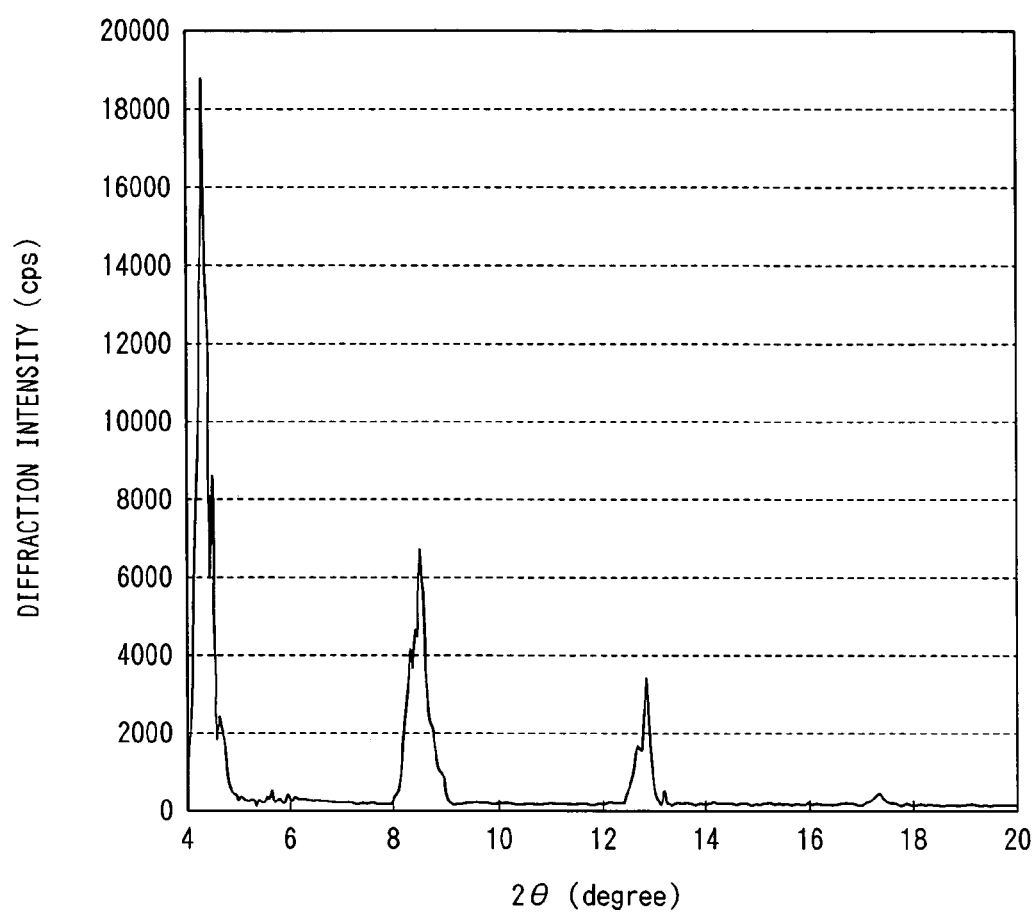
FIG. 13 is an X-ray diffraction pattern of a bis(triisopropylsilylethynyl)pentacene thin film.

As a result of evaluating the structure of the obtained thin film by X-ray diffraction, diffraction peaks (planes (001), (002), (003), and (004)) having an interplanar spacing of 2.1 nm were observed (refer to FIG. 13). The fact that the interplanar spacing corresponds to the major axis length of the molecule showed that 2,3-bis(triisopropylsilylethynyl) pentacene was crystallized with the major axis of the molecule oriented perpendicular to the substrate surface.

In addition, in the same manner as in Example 10, an electrode pattern of a gold thin film was formed on the surface of an n-type silicon substrate with a thermally oxidized film formed thereon. Then, the surface with the electrode pattern was spin-coated with the above described 2,3-bis(triisopropylsilylethynyl)pentacene solution to form a thin film having a thickness of 600 nm.

Figure 14:
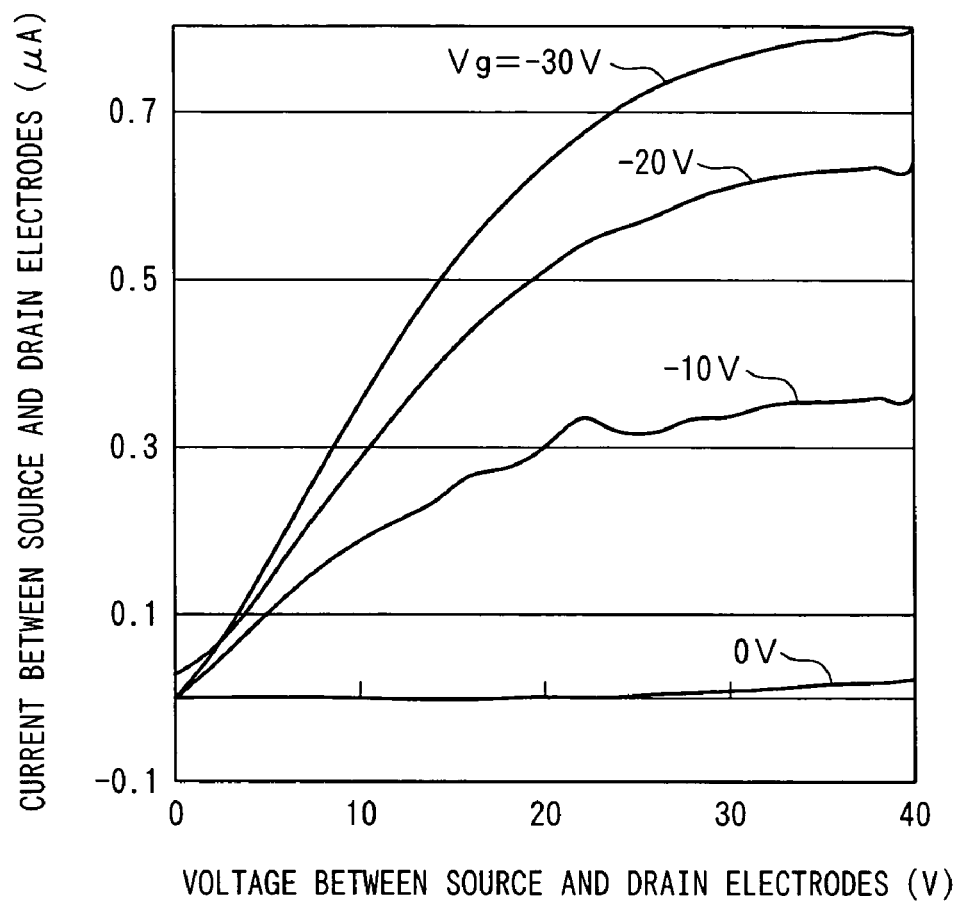
FIG. 14 is a current/voltage curve of a transistor using bis(triisopropylsilylethynyl)pentacene thin films.
Figure 15A:
FIGS. 15A to 15E are cross-sectional views showing the manufacturing steps of transistors using organic semiconductor thin films in accordance with a printing method.
Figure 15B:
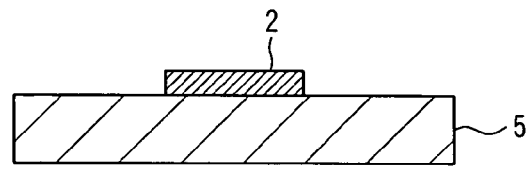
Figure 15C:
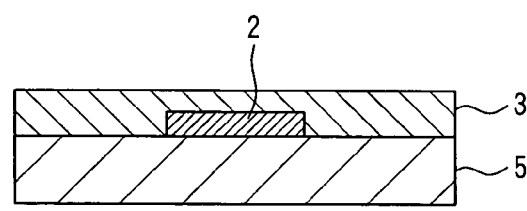
Figure 15D:
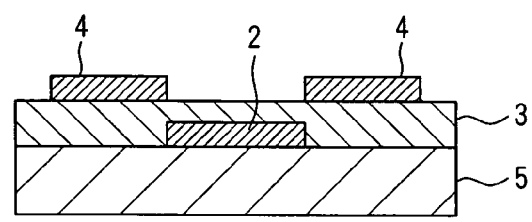
Figure 15E:
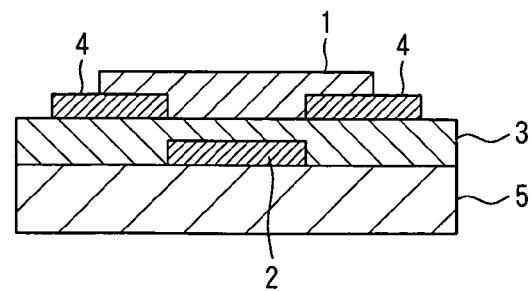

For such a field effect transistor, the voltage between the source and drain electrodes and the current between the source and drain electrodes were measured in the same manner as in Example 10 (refer to FIG. 14). As a result, the saturation of the current was observed, and the carrier mobility determined from the saturation region was 0.08 $cm^2/V \cdot s$.

EXAMPLE 16

A solution of 0.1% by mass of 2,3-difluoropentacene synthesized as described above was prepared by dissolving the same in o-dichlorobenzene in a nitrogen atmosphere. This solution was spin-coated (at a rotational speed of 3,000 rpm for 10 seconds) on a glass substrate, and then o-dichlorobenzene was evaporated to obtain a thin film having a thickness of 50 nm.

As a result of evaluating the structure of the obtained thin film by X-ray diffraction, diffraction peaks having an interplanar spacing of 1.6 nm were observed. The fact that the interplanar spacing corresponds to the major axis length of the molecule showed that 2,3-difluoropentacene was crystallized with the major axis of the molecule oriented perpendicular to the substrate surface.

In addition, a field effect transistor was formed in the same manner as in Example 10, and the voltage between the source and drain electrodes and the current between the source and drain electrodes were measured. As a result, the saturation of the current was observed, and the carrier mobility determined from the saturation region was 0.2 $cm^2/V \cdot s$.

EXAMPLE 17

A solution of 0.2% by mass of 6,13-bis(triisopropylsilylethynyl)pentacene synthesized as described above was prepared by dissolving the same in mesitylene in a nitrogen atmosphere. This solution was spin-coated (at a rotational speed of 500 rpm for 15 seconds) on a glass substrate, and then mesitylene was evaporated to obtain a thin film having a thickness of 160 nm.

As a result of evaluating the structure of the obtained thin film by X-ray diffraction, diffraction peaks having an interplanar spacing of 1.7 nm were observed, which showed that 6,13-bis(triisopropylsilylethynyl)pentacene was crystallized with the triisopropylsilylethynyl group oriented perpendicular to the substrate surface.

In addition, in the same manner as in Example 10, an electrode pattern of a gold thin film was formed on the surface of an n-type silicon substrate with a thermally oxidized film formed thereon. Then, the surface with the electrode pattern was spin-coated with the above described 6,13-bis(triisopropylsilylethynyl)pentacene solution to form a thin film.

For such a field effect transistor, the voltage between the source and drain electrodes and the current between the source and drain electrodes were measured in the same manner as in Example 10. As a result, the saturation of the current was observed, and the carrier mobility determined from the saturation region was 0.12 $cm^2/V \cdot s$.

EXAMPLE 18

A solution of 0.2% by mass of 2,3,9,10-tetrabutylpentacene synthesized as described above was prepared by dissolving the same in toluene in a nitrogen atmosphere. This solution was spray-coated on a glass substrate, and then toluene was evaporated to obtain a thin film having a thickness of 250 nm.

As a result of evaluating the structure of the obtained thin film by X-ray diffraction, diffraction peaks (planes (001), (002), and (003)) having an interplanar spacing of 2.0 nm were observed. The fact that the interplanar spacing corresponds to the major axis length of the molecule showed that 2,3,9,10-tetrabutylpentacene was crystallized with the major axis of the molecule oriented perpendicular to the substrate surface.

In addition, in the same manner as in Example 10, an electrode pattern of a gold thin film was formed on the surface of an n-type silicon substrate with a thermally oxidized film formed thereon. Then, the surface with the electrode pattern was spray-coated with the above described tetrabutylpentacene solution to form a thin film having a thickness of 50 nm.

For such a field effect transistor, the voltage between the source and drain electrodes and the current between the source and drain electrodes were measured in the same manner as in Example 10. As a result, the saturation of the current was observed, and the carrier mobility determined from the saturation region was 0.2 $cm^2/V \cdot s$.

EXAMPLE 19

A nickel thin film (50 nm thick) was formed on a glass substrate (non-alkali glass 0.6 mm thick, Nippon Electric Glass Co., Ltd.) by electron beam vapor deposition. The nickel thin film was coated with photoresist (OFPR-80, Tokyo Ohka Kogyo Co., Ltd.) and subjected to exposure and development using photomask (PLA, Cannon Inc.). Then, the nickel thin film was etched with an acid mixture of concentrated nitric acid, concentrated hydrochloric acid and water (1:1:3, by mass), and the remaining photoresist was dissolved to form a gate electrode pattern.

An $SiO_2$ thin film 200 nm thick was formed on the resultant nickel thin film pattern by RF-sputtering (at substrate temperature of 120° C., using a CFS sputterer manufactured by Shibaura Engineering Works Co., Ltd.) in an argon stream under a pressure of 0.5 Pa.

Next, the substrate was coated with the photoresist mentioned above and subjected to exposure and development using photo mask as described above. A titanium thin film 10 nm thick was formed by electron beam vapor deposition, a gold thin film 40 nm thick was laminated and lift off was performed using acetone to form patterns of titanium and gold thin film.

In addition, the solution of aforementioned 2,3,9,10-tetrabutylpentacen in toluene was applied onto this substrate by spin coating to form a thin film 110 nm thick, and a transistor was prepared. The voltage and current between the source and drain electrodes of the resultant transistor were determined, and carrier mobility determined from the results was 0.18 $cm^2/V \cdot s$.

EXAMPLE 20

A transistor was prepared in the same way as Example 19 except that aromatic polyamide film (Aramica, 4.5 μm thick, Asahi Kasei Corporation) was used as the substrate. The voltage and current between the source and drain electrodes of the transistor were determined, and carrier mobility determined from the results was 0.22 cm$^2$/V·s.

EXAMPLE 21

A nickel thin film (50 nm thick) was formed on a glass substrate (low-alkali glass 7124, Corning Corp.) by electron beam vapor deposition. The nickel thin film was coated with photoresist (OFPR-80, Tokyo Ohka Kogyo Co., Ltd.) and subjected to exposure and development using photomask (PLA, Cannon Inc.). Then, the nickel thin film was etched with an acid solution prepared by diluting the mixture of concentrated nitric acid and concentrated hydrochloric (1:1, by mass) with water, and the remaining photoresist was dissolved to form a gate electrode pattern and gate lines.

A SiO$_2$ insulator layer 200 nm thick was formed on the nickel thin film pattern thus formed by RF-sputtering as in Example 19, and patterning was performed by reactive ion etching (plasma etching by methane-argon). In addition, an indium tin oxide thin film 150 nm thick was formed thereon by RF-sputtering (using a CFS sputterer manufactured by Shibaura Engineering Works Co., Ltd.) in an argon stream under a pressure of 0.4 Pa. A sintered product of indium oxide and tin oxide (1:9) was used as the target.

Next, the substrate was coated with photoresist and subjected to exposure and development using photomask as in Example 19. After etching with dilute hydrochloric acid, photoresist was further applied followed by exposure and development using photomask. A titanium thin film 10 nm thick was formed on the resist pattern obtained by electron beam vapor deposition and a gold thin film 40 nm thick was laminated. In addition, lift off was performed using acetone to form source and drain electrode patterns and data lines.

The solution of aforementioned 2,3,9,10-tetramethylpentacen in toluene was applied onto this substrate by screen printing to form a semiconductor thin film (100 nm thick) of 2,3,9,10-tetramethylpentacene between the source and drain electrodes so as to connect these electrodes.

The size of the pixels partitioned by the gate lines and data lines was 1 mm×1 mm and the size of the indium tin oxide thin film formed in each pixel was 0.8 mm×0.7 mm. The source and drain electrodes of the transistor had a width of 20 μm and a length of 800 μm, and the number of pixels was 16×64.

In addition, a 0.5% (by mass) aqueous solution of polyvinyl alcohol (20,000 in molecular weight, Aldrich) was applied onto the substrate and dried, and a coat of polyvinyl alcohol 40 nm thick was formed. Furthermore, a solution of polyimide, prepared by heating and allowing 2,3,5-tricarboxycyclopentylacetic acid dianhydride and diaminodiphenylmethane to react in N-methyl-2-pyrrolidone, was applied by spin coating and heated at 130° C. to form a liquid crystal oriented film. Then, rubbing was applied to this liquid crystal oriented film.

Next, epoxy resin (3026, ThreeBond Corp.) containing 10 μm glass spacers was applied to the peripheral region of the surface of the substrate. Then, a glass plate coated all over with indium tin oxide thin film was laid on the substrate with the face with indium tin oxide thin film facing the substrate. Thus, a space was produced between the substrate and the glass plate according to the size of the glass spacers. Note that the epoxy resin was not applied to all the peripheral region and a portion was left uncoated. This portion will serve as an injection port used to inject liquid crystal material into the space between the substrate and the glass plate.

A liquid crystalline substance (4-cyanophenyl-4'-pentylcyclohexane) exhibiting twist nematic liquid crystallinity and 5 μm spacers (Epista, Nippon Shokubai Co., Ltd.) were injected from the injection port, and the injection port was sealed with the aforementioned epoxy resin. Lastly, a polarizing film was attached to the surface of the glass plate, and a liquid crystal display panel was completed.

A flexible pattern circuit to which a driver was connected through anisotropic conductive film was connected to the data line takeoff electrode and gate line takeoff electrode of the liquid crystal display panel. Then, an external pulse generator was used to activate pixels; a pattern was displayed on the liquid crystal display panel.

EXAMPLE 22

On the glass plate equipped with various electrodes and semiconductor thin films fabricated in Example 21, a thin film of alumiquinolinol complex (50 nm thick) to serve as an electron transport and light emitting layer was formed, and a 30 nm thick thin film of triphenyldiamine derivative (N,N'-diphenyl-N,N'-ditoluylbenzidine) was further formed. In addition, after forming a 100 nm thin film of silver magnesium, a glass plate coated all over with indium tin oxide thin film was placed on the glass substrate with the face with indium tin oxide thin film facing the glass substrate. Then, a circuit similar to that in Example 21 was installed.

The light emitting display device thus formed was capable of displaying patterns when the pixels were activated by an external pulse generator.

EXAMPLE 23

A solution of 1% by mass of 6,13-diphenylpentacene synthesized as described above was prepared by dissolving the same in toluene in a nitrogen atmosphere. This solution was spin-coated (at a rotational speed of 2,500 rpm for 15 seconds) on a silicon wafer, and then toluene was evaporated to obtain a thin film having a thickness of 350 nm.

As a result of evaluating the structure of the obtained thin film by X-ray diffraction, diffraction peaks (planes (001), (002), and (003)) having an interplanar spacing of 1.47 nm were observed. The fact that the interplanar spacing corresponds to the major axis length of the molecule showed that 6,13-diphenylpentacene was crystallized with the major axis of the molecule oriented perpendicular to the substrate surface.

In addition, in the same manner as in Example 10, an electrode pattern of a gold thin film was formed on the surface of an n-type silicon substrate with a thermally oxidized film formed thereon. Then, the surface with the electrode pattern was spin-coated with the above described 6,13-diphenylpentacene solution to form a thin film having a thickness of 380 nm.

For such a field effect transistor, the voltage between the source and drain electrodes and the current between the source and drain electrodes were measured in the same manner as in Example 10. As a result, the saturation of the current was observed, and the carrier mobility determined from the saturation region was 0.05 cm$^2$/V·s.

EXAMPLE 24

A solution of 1% by mass of 5,7,12,14-tetraphenylpentacene synthesized as described above was prepared by dissolving the same in mesitylene in a nitrogen atmosphere.

This solution was spin-coated (at a rotational speed of 2,500 rpm for 15 seconds) on a silicon wafer, and then mesitylene was evaporated to obtain a thin film having a thickness of 400 nm.

As a result of evaluating the structure of the obtained thin film by X-ray diffraction, diffraction peaks (planes (001) and (002)) having an interplanar spacing of 1.49 nm were observed. The fact that the interplanar spacing corresponds to the major axis length of the molecule showed that 5,7,12,14-tetraphenylpentacene was crystallized with the major axis of the molecule oriented perpendicular to the substrate surface.

In addition, in the same manner as in Example 10, an electrode pattern of a gold thin film was formed on the surface of an n-type silicon substrate with a thermally oxidized film formed thereon. Then, the surface with the electrode pattern was spin-coated with the above described 5,7,12,14-tetraphenylpentacene solution to form a thin film having a thickness of 400 nm.

For such a field effect transistor, the voltage between the source and drain electrodes and the current between the source and drain electrodes were measured in the same manner as in Example 10. As a result, the saturation of the current was observed, and the carrier mobility determined from the saturation region was 0.03 $cm^2/V \cdot s$.

EXAMPLE 25

A method for manufacturing a thin film transistor by forming electrodes, insulator layers and semiconductor layers by printing method is described with reference to FIGS. 15A to 15E.

Carbon paste (JEF010, Atchison) was applied onto a glass substrate 5 (non-alkali glass 0317, 0.5 nm thick, Corning Corp.) by screen printing to form the pattern for a gate electrode 2.

A 1% (by mass) solution of polyacrylonitrile (number-average molecular weight 22600, Aldrich) in N-methyl-2-pyrrolidone was evenly applied to form a 220 nm thick insulator layer 3.

Then, electroless gold plating liquid (K-24N, Kojundo Chemical Laboratory Co., Ltd.) was applied onto this glass substrate 5 by ink jet printing using patterning. Then, a gold thin film (60 nm thick) pattern was formed at 90° C. to form source and drain electrodes 4 and 4.

After washing with water and drying, the 0.3% (by mass) solution of aforementioned 2,3,9,10-tetramethylpentacene in mesitylene was printed on the glass substrate 5 by patterning using a silicone rubber printing plate to form a 120 μm thick semiconductor layer 1.

Determination of the voltage and current between the source and drain electrodes was performed on the transistor thus obtained as in Example 10, and current saturation was observed. Carrier mobility determined from the saturation region was 0.28 $cm^2/V \cdot s$.

EXAMPLE 26

A solution of 1% by mass of 6,13-bis(trimethylsilyldiethynyl)pentacene synthesized as described above was prepared by dissolving the same in toluene in a nitrogen atmosphere. This solution was spin-coated (at a rotational speed of 2,500 rpm for 15 seconds) on a glass substrate, and then toluene was evaporated to obtain a thin film having a thickness of 0.6 μm.

The thin film was irradiated with ultraviolet rays via a photomask. Then, the glass substrate was immersed in a mixed solution of ethanol and toluene (ethanol/toluene=2/1) to remove 6,13-bis(trimethylsilyldiethynyl)pentacene in a non-irradiated part. Since the ethynyl group was reacted and modified by the irradiation of ultraviolet rays, a thin film has remained in the irradiated part to form a pattern.

As a result of evaluating the structure of the obtained thin film by X-ray diffraction, diffraction peaks (planes (001) and (002)) having an interplanar spacing of 1.82 nm were observed.

In addition, in the same manner as in Example 10, an electrode pattern of a gold thin film was formed on the surface of an n-type silicon substrate with an oxidized film having a thickness of 200 nm. Then, the surface with the electrode pattern was spin-coated with the above described 6,13-bis (trimethylsilyldiethynyl)pentacene solution to form a thin film having a thickness of 0.6 nm. Then, it was irradiated with ultraviolet rays via a photomask in the same manner as described above and patterned to form a transistor.

For such a transistor, the voltage between the source and drain electrodes and the current between the source and drain electrodes were measured in the same manner as in Example 10. As a result, the saturation of the current was observed, and the carrier mobility determined from the saturation region was 0.12 $cm^2/V \cdot s$.

COMPARATIVE EXAMPLE

A solution of 1% by mass of a compound with tetrachlorobenzene added to the central ring of pentacene synthesized as described above was prepared by dissolving the same in toluene in a nitrogen atmosphere.

This solution was applied on a glass substrate by blade coating and dried to form a thin film. The measured value of the thickness of the thin film by a stylus profilometer was 220 nm.

Next, this glass plate was put in a silica tube and heated under an argon gas stream using a heating oven, where the temperature was increased at a temperature-increasing rate of 50° C./minute up to 200° C., and the glass plate was heated at 200° C. for 10 minutes.

The measurement of the thickness of the obtained thin film showed a thickness distribution of 50 to 150 nm, and the film had a rough surface. As a result of evaluating the structure of the obtained thin film by X-ray diffraction, a peak (2θ: 6.6°, interplanar spacing: 1.5 nm) was barely observed.

In addition, in the same manner as in Example 10, an electrode pattern of a gold thin film was formed on the surface of an n-type silicon substrate with an oxidized film having a thickness of 200 nm. Then, the surface with the electrode pattern was applied with the above described toluene solution and heat-treated at 200° C. in the same manner as described above.

The adjacent gold electrode pads (source electrode and drain electrode) of the device thus formed on the substrate and the gate electrode on the back surface of the substrate were communicated with a tungsten needle prober to measure the current and voltage between the gold electrodes in the same manner as in Example 10. Note that the channel width of the gold electrode is 50 μm and the channel length is 500 μm.

The measurement was carried out by setting the voltage of the gate electrode at −90 V and the voltage of the drain electrode at −50 V. As a result, the current value was found to be about 130 nA, from which the carrier mobility was determined to be $2 \times 10^{-3} cm^2/V \cdot s$.

INDUSTRIAL APPLICABILITY

As described in detail above, defect-free thin films of polyacenes can be fabricated using the solution for organic semiconductors in accordance with the present invention.

The organic semiconductor thin films of the present invention have superior semiconductor characteristics since these thin films are almost defect-free and have high crystallinity.

In addition, the organic semiconductor devices of the present invention have superior electronic characteristics.

The invention claimed is:

1. A solution for organic semiconductors comprising a polyacene and a solvent at least comprising a polvacene dissolving solvent capable of dissolving said polyacene, wherein said polyacene dissolving solvent is at least one compound selected from the group consisting of halogenated aromatic hydrocarbons, halogenated aliphatic hydrocarbons, aromatic hydrocarbons, lactones and carbonates, wherein said polyacene is represented by the chemical formula (1):

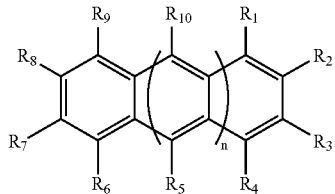

wherein at least one of the functional groups from $R_1$ to $R_{10}$ comprises one or more of groups selected from the group consisting of aliphatic hydrocarbons such as alkyls, alkenyls and alkynyls, alkoxyls, halogens, acyls, esters, ethers, aminos, amides, cyanos, silyls and photoreactive groups, and the others of said functional groups are hydrogen atoms; and n represents an integer of from 2 to 7.

2. A solution for organic semiconductors comprising a polyacene and a solvent at least comprising a polyacene dissolving solvent capable of dissolving said polvacene, wherein said polyacene dissolving solvent is at least one compound selected from the group consisting of halogenated aromatic hydrocarbons, halogenated aliphatic hydrocarbons, aromatic hydrocarbons, lactones and carbonates, wherein said polyacene is represented by the chemical formula (1):

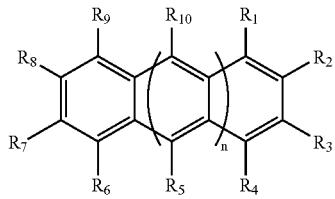

wherein at least one of the functional groups $R_2$, $R_3$, $R_7$ and $R_8$ comprises one or more groups selected from the group consisting of aliphatic hydrocarbons such as alkyls, alkenyls and alkynyls, alkoxyls, halogens, acyls, esters, ethers, aminos, amides, cyanos, silyls and photoreactive groups, and the others of said functional groups as well as $R_1$, $R_4$, $R_5$, $R_6$, $R_9$ and $R_{10}$ are hydrogen atoms; and n represents an integer of from 2 to 7.

3. A solution for organic semiconductors comprising a polvacene and a solvent at least comprising a polyacene dissolving solvent capable of dissolving said polyacene, wherein said polvacene dissolving solvent is at least one compound selected from the group consisting of halogenated aromatic hydrocarbons. halogenated aliphatic hydrocarbons, aromatic hydrocarbons, lactones and carbonates, wherein said polyacene is represented by the chemical formula (1):

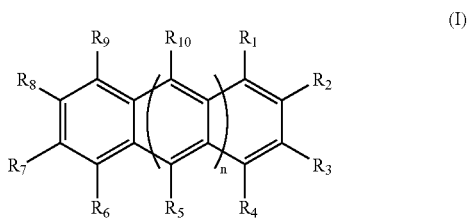

wherein at least one of the functional groups $R_1$, $R_4$, $R_5$, $R_6$, $R_9$ and $R_{10}$ comprises one or more groups selected from the group consisting of aliphatic hydrocarbons such as alkyls, alkenyls and alkynyls, alkoxyls, halogens, acyls, esters, ethers, aminos, amides, cyanos, silyls and photoreactive groups, and the others of said functional groups as well as $R_2$, $R_3$, $R_7$ and $R_8$ are hydrogen atoms; and n represents an integer of from 2 to 7.

4. The solution for organic semiconductors according to any one of claims 1 to 3, wherein said halogenated aromatic hydrocarbon is a dihalogenated aromatic hydrocarbon.

5. The solution for organic according to any one of claims 1 to 3, wherein said polyacene is contained in an amount of from 0.01 to 8% by mass and said polyacene dissolving solvent is contained in an amount of from 10 to 99.99% by mass based on the total mass.

6. The solution for organic semiconductors according to any one of claims 1 to 3, wherein electron-donating molecules or electron-accepting molecules capable of forming a charge-transfer complex with said polyacene are present in an amount of 10% or less by mass based on the total mass.

7. The organic semiconductor thin film containing a polyacene, wherein said polyacene is represented by the chemical formula (1):

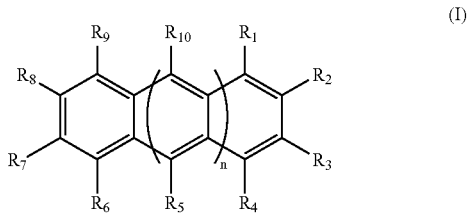

wherein at least one of the functional groups $R_2$, $R_3$, $R_7$ and $R_8$ comprises one or more groups selected from the group consisting of aliphatic hydrocarbons such as alkyls, alkenyls and alkynyls, alkoxyls, halogens, acyls, esters, ethers, aminos, amides, cyanos, silyls and photoreactive groups, and the others of said functional groups as well as $R_1$, $R_4$, $R_5$, $R_6$, $R_9$ and $R_{10}$ are hydrogen atoms; and n represents an integer of from 2 to 7.

8. The organic semiconductor thin film containing a polyacene, wherein said polyacene is represented by the chemical formula (1):

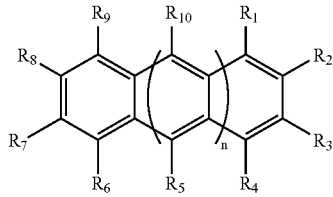

wherein at least one of the functional groups $R_1$, $R_4$, $R_5$, $R_6$, $R_9$ and $R_{10}$ comprises one or more groups selected from the group consisting of aliphatic hydrocarbons such as alkyls, alkenyls and alkynyls, alkoxyls, halogens, acyls, esters, ethers, aminos, amides, cyanos, silyls and photoreactive groups, and the others of said functional groups as well as $R_2$, $R_3$, $R_7$ and $R_8$ are hydrogen atoms; and n represents an integer of from 2 to 7.

9. An organic semiconductor thin film formed from the solution for organic semiconductor described in any one of claims 1 to 3 by vaporizing said solvent.

10. An organic semiconductor thin film formed from the solution for organic semiconductor described in claim 6 by vaporizing said solvent, wherein at least part of said electron-donating molecules or said electron-accepting molecules are removed.

11. The organic semiconductor thin film according to any one of claims 7 or 8, wherein said organic semiconductor thin film is a crystalline organic semiconductor thin film formed on a substrate; and the long axis of the molecule of said polyacene is perpendicular to the surface of said substrate.

12. The organic semiconductor thin film according to any one of claims 7 or 8, wherein carrier mobility is 0.03 cm²/V·s or more.

13. The organic semiconductor thin film according to any one of claims 7 or 8, wherein denaturation is present due to the reaction of said photoreactive group to radiation energy.

14. A method for manufacturing an organic semiconductor thin film, wherein an organic semiconductor thin film formed from the solution for organic semiconductor described in any one of claims 1 to 3, by vaporizing said solvent is doped with electron-donating molecules or electron-accepting molecules capable of forming a charge-transfer complex with said polyacene.

15. A method for manufacturing an organic semiconductor thin film from the solution for organic semiconductor described in any one of claims 1 to 3, by vaporizing said solvent, wherein at least one of temperature gradient, electric field and magnetic field is applied to control the crystal growth of said polyacene.

16. An organic semiconductor device comprising an organic semiconductor thin film containing a polyacene, wherein said polyacene is represented by the chemical formula (1):

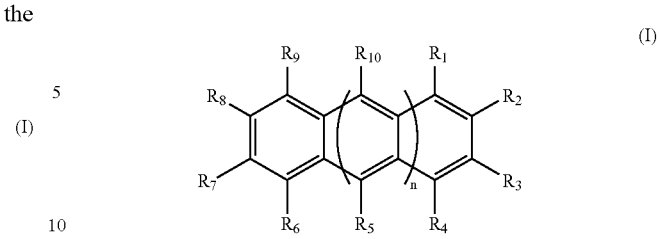

wherein at least one of the functional groups $R_2$, $R_3$, $R_7$ and $R_8$ comprises one or more groups selected from the group consisting of aliphatic hydrocarbons such as alkyls, alkenyls and alkynyls, alkoxyls, halogens, acyls, esters, ethers, aminos, amides, cyanos, silyls and photoreactive groups, and the others of said functional groups as well as $R_1$, $R_4$, $R_5$, $R_6$, $R_9$ and $R_{10}$ are hydrogen atoms; and n represents an integer of from 2 to 7.

17. The organic semiconductor device according to claim 16, wherein the carrier mobility of said organic semiconductor thin film is 0.03 cm²/V·s or more.

18. A transistor comprising a gate electrode, an insulator layer, a source electrode, a drain electrode and a semiconductor layer, wherein said semiconductor layer comprises an organic semiconductor thin film containing a polyacene, wherein said polyacene is represented by the chemical formula (1):

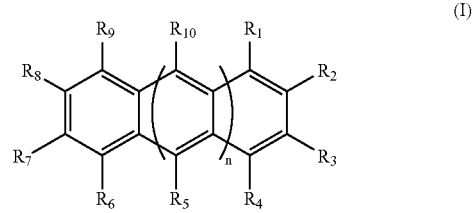

wherein at least one of the functional groups $R_2$, $R_3$, $R_7$ and $R_8$ comprises one or more groups selected from the group consisting of aliphatic hydrocarbons such as alkyls, alkenyls and alkynyls, alkoxyls, halogens, acyls, esters, ethers, aminos, amides, cyanos, silyls and photoreactive groups, and the others of said functional groups as well as $R_1$, $R_4$, $R_5$, $R_6$, $R_9$ and $R_{10}$ are hydrogen atoms; and n represents an integer of from 2 to 7.

19. A transistor comprising a gate electrode, an insulator layer, a source electrode, a drain electrode and a semiconductor layer, wherein said semiconductor layer comprises an organic semiconductor thin film containing a polyacene, wherein said polyacene is represented by the chemical formula (1):

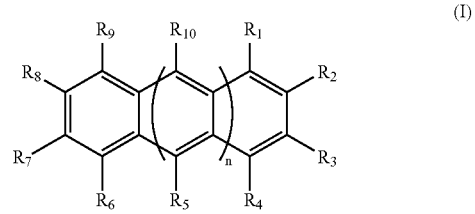

wherein at least one of the functional groups from $R_1$ to $R_{10}$ comprises one or more of groups selected from the group consisting of aliphatic hydrocarbons such as alkyls, alkenyls and alkynyls, alkoxyls, halogens, acyls, esters, ethers, aminos, amides, cyanos, silyls and photoreactive groups, and the others of said functional groups are hydrogen atoms; and n represents an integer of from 2 to 7.

20. A transistor comprising a gate electrode, an insulator layer, a source electrode, a drain electrode and a semiconductor layer, wherein said semiconductor layer comprises an organic semiconductor thin film containing a polyacene wherein said polyacene is represented by the chemical formula (1):

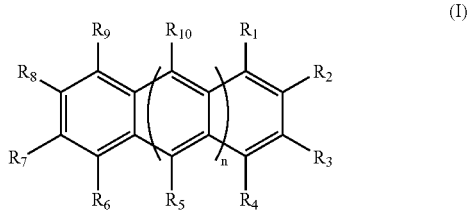

wherein at least one of the functional groups $R_1$, $R_4$, $R_5$, $R_6$, $R_9$ and $R_{10}$ comprises one or more groups selected from the group consisting of aliphatic hydrocarbons such as alkyls, alkenyls and alkynyls, alkoxyls, halogens, acyls, esters, ethers, aminos, amides, cyanos, silyls and photoreactive groups, and the others of said functional groups as well as $R_2$, $R_3$, $R_7$ and $R_8$ are hydrogen atoms; and n represents an integer of from 2 to 7.

21. The transistor according to any one of claims 18, 19, and 20 wherein the carrier mobility of said organic semiconductor thin film is 0.03 cm$^2$/V·s or more.

22. A method for manufacturing the organic semiconductor device according to any one of claims 18, 19, and 20 wherein any electrode, any insulator layer and any semiconductor layer of said organic semiconductor device is formed by printing or applying the solution of claims 2 to 4.

23. A display comprising a pixel face consisting of a large number of pixels, wherein the organic semiconductor device according to claim 16 or 17, or the transistor according to any one of claims 18, 19, and 20, is allocated to each of said pixels.

24. A method for manufacturing the display according to claim 23, wherein the electrode, insulator layer and semiconductor layer of said organic semiconductor device or said transistor are formed by printing or applying a solution.

* * * * *